United States Patent
Sutardja

(10) Patent No.: US 7,443,329 B2
(45) Date of Patent: *Oct. 28, 2008

(54) CAPACITIVE DIGITAL TO ANALOG AND ANALOG TO DIGITAL CONVERTERS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 11/481,476

(22) Filed: Jul. 6, 2006

(65) Prior Publication Data

US 2007/0052567 A1 Mar. 8, 2007

Related U.S. Application Data

(63) Continuation of application No. 11/293,917, filed on Dec. 5, 2005.

(60) Provisional application No. 60/715,078, filed on Sep. 8, 2005.

(51) Int. Cl.
*H03M 1/66* (2006.01)
(52) U.S. Cl. ...................... 341/150; 341/144
(58) Field of Classification Search ............... 341/150, 341/142, 118, 144, 163, 155
See application file for complete search history.

(56) References Cited

U.S. PATENT DOCUMENTS

| | | | |
|---|---|---|---|
| 4,760,376 A * | 7/1988 | Kobayashi et al. | 341/155 |
| 4,800,333 A | 1/1989 | Milkovic | |
| 5,016,012 A | 5/1991 | Scott et al. | |
| 5,561,426 A | 10/1996 | Zarabadi et al. | |
| 5,936,437 A | 8/1999 | Kusumoto et al. | |
| 6,154,162 A | 11/2000 | Watson et al. | |
| 6,297,759 B1 | 10/2001 | Lewyn | |
| 6,441,765 B1 | 8/2002 | Aram | |
| 6,522,277 B2 | 2/2003 | Fujimori et al. | |
| 6,590,517 B1 | 7/2003 | Swanson | |

(Continued)

FOREIGN PATENT DOCUMENTS

DE 30 33 914 A1 3/1981

(Continued)

OTHER PUBLICATIONS

Amourah Mezyad M. et al; "An MSB-First Monotonic Switched capacitor serial DAC"; IEEE, vol. 1, 2002, pp. I-571-I-574, month unknown.

(Continued)

*Primary Examiner*—Jean B Jeanglaude

(57) ABSTRACT

A digital to analog converter (DAC) comprises X capacitive DACs that are connected together in series, wherein X is an integer greater than one. Each of the X capacitive DACs comprise M switches wherein M is an integer greater than one; a signal input; a signal output; and M capacitances that communicate with the M switches, respectively, and that have first and second ends and substantially equal capacitance values. The M switches selectively connect the first ends of the M capacitances to the signal output. The M switches connect the second end of a selected one of the M capacitances to the signal input. A first DAC has a signal output that communicates with the signal input of one of the X capacitive DACs.

27 Claims, 28 Drawing Sheets

U.S. PATENT DOCUMENTS

| | | |
|---|---|---|
| 6,600,437 B1 * | 7/2003 | Confalonieri et al. ....... 341/150 |
| 6,822,601 B1 | 11/2004 | Liu et al. |
| 6,839,015 B1 | 1/2005 | Sutardja et al. |
| 6,914,550 B2 | 7/2005 | Cai |
| 6,967,611 B2 | 11/2005 | Afriss et al. |
| 7,046,182 B1 | 5/2006 | Ja et al. |
| 7,106,240 B2 | 9/2006 | Crigean |
| 2002/0186157 A1 | 12/2002 | Tanaka |
| 2003/0234736 A1 | 12/2003 | Tachibana |
| 2005/0078026 A1 | 4/2005 | Cai |
| 2005/0200510 A1 * | 9/2005 | Yoshida et al. ............. 341/155 |

FOREIGN PATENT DOCUMENTS

| | | |
|---|---|---|
| EP | 0 282 034 A2 | 9/1988 |
| JP | 09 214344 A | 8/1997 |
| JP | 10 075176 | 3/1998 |
| WO | WO 82/03955 | 11/1982 |
| WO | WO 00/62530 | 10/2000 |
| WO | WO 01/84717 | 11/2001 |
| WO | WO 2005/041418 | 5/2005 |

OTHER PUBLICATIONS

Runhua Sun et al; "A pipelined A/D converter for high-speed and high-resolution application"; IEEE 2002, pp. I-917 through I-920, month unknown.

Communication from the European Patent Office dated Jan. 4, 2007 with the Partial European Search Report for Application No. 06016268.2; 6 pages.

Communication from the European Patent Office dated Nov. 22, 2006 with the extended European Search Report for Application No. 06015726.0-2206; 6 pages.

Communication from the European Patent Office dated Dec. 12, 2006 with the extended European Search Report for Application No. 06016259.1-2206; 13 pages.

Communication from the European Patent Office dated Mar. 23, 2007 forwarding the extended European Search Report for Application No. 06016268.2-2206; 11 pages.

Official Action including the Search Report and Written Opinion from the Intellectual Property Office of Singapore dated Sep. 21, 2007 for Application No. SG200605088-4; 10 Pages.

Official Communication from the European Patent Office dated Oct. 29, 2007 for Application No. 06 016 268.2-2206; 6 Pages.

Official Communication from the European Patent Office dated Oct. 29, 2007 for Application No. 06 015 726.0-2206; 4 Pages.

Allen Holderg; CMOS Analog Circuit Design; CMOS Digital-Analog and Analog-Digital Converters, Ch. 10; 1986; 69 pages.

L. Richard Carley; A Noise-Shaping Coder Topology for 15+ Bit Converters; Apr. 1989; 7 pages.

J. John Connolly, Thomas O. Redfern, Sing w. Chin, and Thomas M. Frederiksen; A Monolithic 12 b+Sign Successive Approximatino A/D Converter; Feb. 1979; 2 pages.

Roubik Gregorian, Gabor C. Temes; Analog MOS Integrated Circuits for Signal Processing; Ch. 6; 52 pages, no date.

Mark N. Horenstein; Boston University; Microelectronic Circuits and Devices; 1995; 14 pages.

Peicheng Ju, Ken Suyama, Paul F. Ferguson, Jr., and Wai Lee; A 22-kHz Multibit Switched-Capacitor Sigma-Delta D/A Converter with 92 dB Dynamic Range; Dec. 1995, 10 pages.

Shin-II Lim, Seung-Hoon Lee, Sun-Young Hwang; A 12b 199NGz 250mW CMOS A/D Converter; 3 pages, no date.

Haiqing Lin, Richard Schreier; A Bandpass Mismatch-Shaped Multi-Bit Switched-Capacitor DAC using Butterfly Shuffler;1999; 9 pages.

Siamak Mortezapour and Edward K. F. Lee; A I-V, 8-Bit Successive Approximation ADC in Standard CMOS Process; Apr. 2000; 5 pages.

Marcel J.M.Pelgram; Session XIV: Analog Techniques; 3 pages, no date.

Thomas P. Redfern, Joseph J. Connolly, Jr., Sing W. Chin, and Thomas M. Frederiksen; A Monolithic Charge-Balancing Successive Approximation A/D Technique; Dec. 1979; 9 pages.

Thomas P. Redfern, Joseph J. Connolly, Jr., Sing W. Chin, and Thomas M. Frederiksen; Session XIV: Data Acquisition II; A Monolithic Charge-Balancing Successive Approximation A/D Technique; 1979; 2 pages.

Sehat Sutardja; A Pipelined 13-bit 250-ks/s, 5-V Analog-to-Digital Converter; Dec. 1988; 8 pages.

Sehat Sutardja, Paul R. Gray; Session XV A/D Conversion; A 250ks/s 13b Pipelined A/D Converter; 3 pages, no date.

Y.S. Yee, L. M. Terman, and L. G. Heller; A Two-Stage Weighted Capacitor Network for D/A-A/D Conversion; Aug. 1979; 4 pages.

Application of the Operational Transconductance Amplifier (OTA) to Voltage-conrolled Amplifiers and Active Filters; W. Grise, Department of IET, Morehead State University, Morehead, KY; 11 pages, no date.

Understanding SAR ADCs; Maxim/Dallas Semiconductor App Notes 1080; Mar. 1, 2001; 8 pages.

* cited by examiner

V=V_ref
C= Node 130
G=Ground
O=Open
C=Closed
A=Amp Output

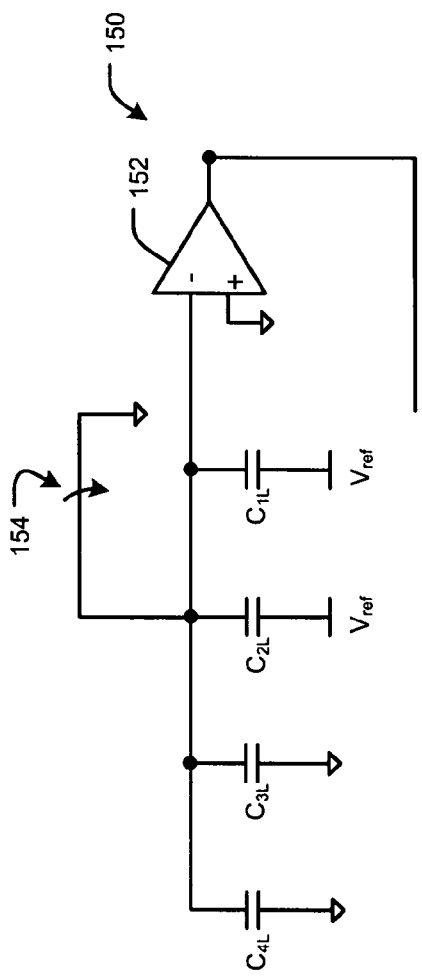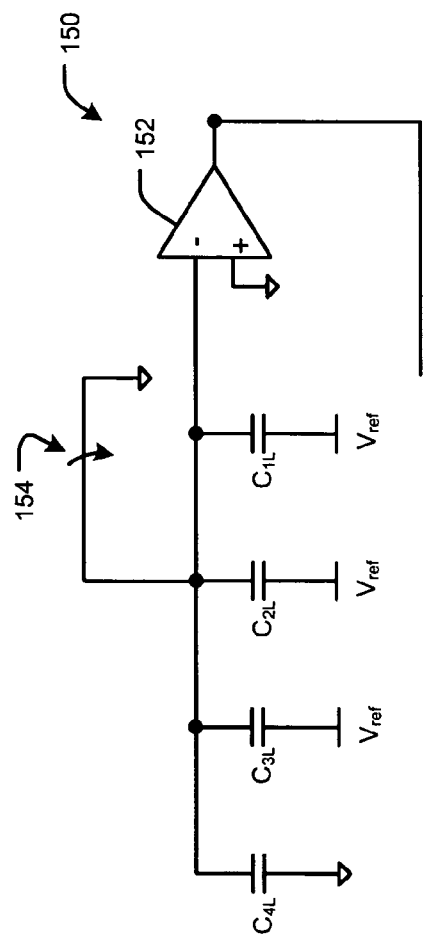

FIG. 8J

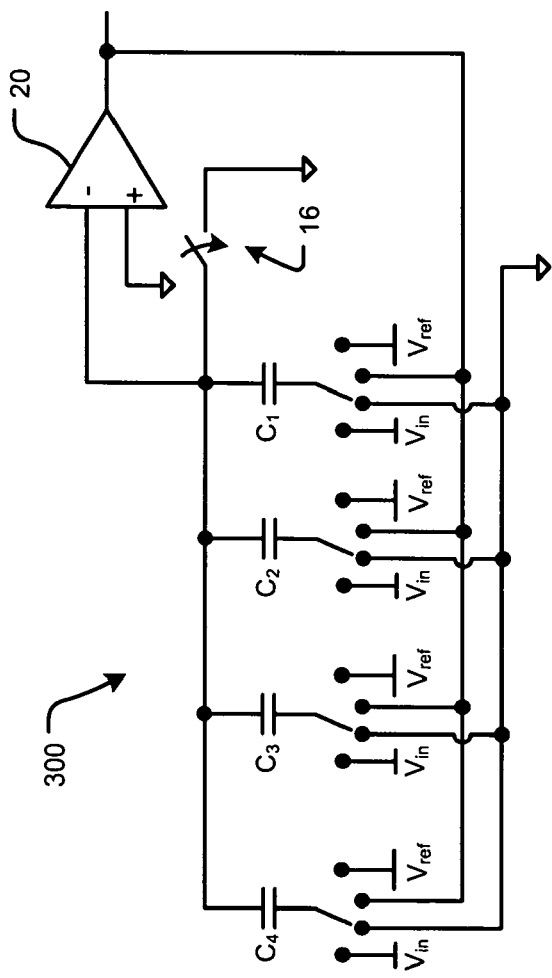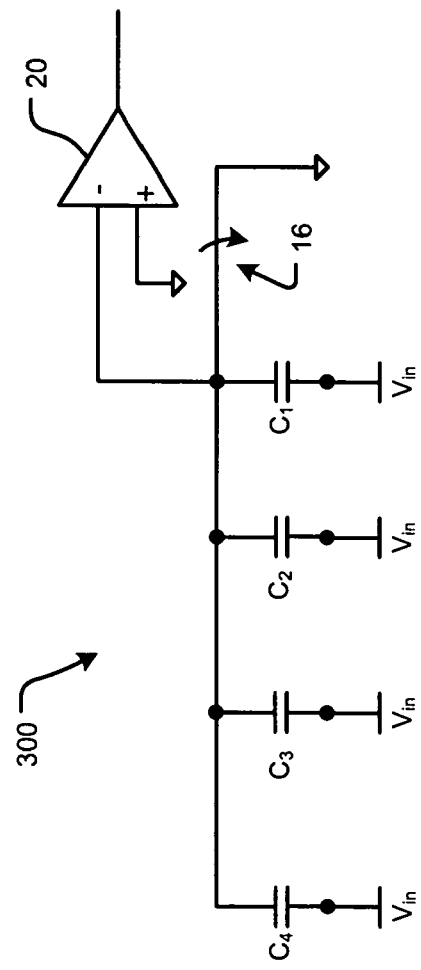
FIG. 12A  FIG. 12B

| Switch | A Sample | A Residue Amp | B Sample | B Residue Amp | C Sample | C Residue Amp | D Sample | D Residue Amp |
|---|---|---|---|---|---|---|---|---|
| 4 | Vin | G | Vin | G | Vin | G | Vin | F |
| 3 | Vin | G | Vin | G | Vin | F | Vin | Vref |
| 2 | Vin | F | Vin | F | Vin | Vref | Vin | Vref |
| 1 | Vin | | Vin | Vref | Vin | Vref | Vin | Vref |

Vin= input voltage
G=Ground
Vref= reference voltage
F=Feedback

CAPACITIVE DIGITAL TO ANALOG AND ANALOG TO DIGITAL CONVERTERS

CROSS-REFERENCE TO RELATED APPLICATIONS

The present application is a Continuation of U.S. Ser. No. 11/293,917 filed Dec. 5, 2005, which claims priority under 35 U.S.C. Section 119(e) from U.S. Provisional Application No. 60/715,078, filed on Sep. 8, 2005. The disclosures of the above applications are incorporated herein by reference in their entirety.

FIELD OF THE INVENTION

The present invention relates to digital to analog (D/A) and analog to digital (A/D) converters, and more particularly to capacitive and/or resistive D/A and A/D converters.

BACKGROUND OF THE INVENTION

Digital to analog (D/A) converters can include arrays of capacitors that are selectively switched to convert a digital signal to an analog counterpart. However, mismatch between capacitors may cause the D/A converter to be non-monotonic. Monotonicity in a D/A converter means that as the digital input to the converter increases over a full-scale range, the analog output never exhibits a decrease between one conversion step and a subsequent conversion step. In other words, the slope of the transfer characteristic is never negative in a monotonic converter.

Referring now to FIG. 1A, a D/A converter 10 is shown. The D/A converter 10 includes a binary capacitor array 14, switches 16 and 18, an operational amplifier (opamp) 20, and a capacitor $C_f$ in a feedback arrangement with the opamp 20. Each of the capacitors in the array 14 have different values. More particularly, each capacitor in the array 14 is twice the value of the preceding capacitor. Switches SW selectively switch the capacitors in the array 14 between a voltage reference and a reference potential such as ground.

In use, the D/A converter 10 has sampling and integration stages. In the sampling stage, the switch 16 closes and selective ones of the capacitors are charged to the voltage reference as determined by the switches. In the integrating phase, the switch 16 is opened and the analog output is generated. For example, a four bit array may close a first or most significant bit (MSB) switch and a least significant bit (LSB) switch to represent 9/16 of a voltage reference.

Referring now to FIG. 1B, a non-monotonic output of a D/A converter is shown. For example, the analog output exhibits a decrease from one conversion step to the subsequent conversion step as shown at in FIG. 1B at 44. The non-monotonic output may be due to capacitor mismatch. For example, the capacitor $2^N-1C$ may be different than $2^N-2C+2^{N-3}C+\ldots+2C+C$. Ideally, $2^N-1C-(2^{N-2}C+2^N-3C+\ldots+2C+C)=C$. In other words, the difference between the MSB capacitor and the rest of the capacitors should be equal to a smallest or LSB capacitor Referring now to FIG. 2, a D/A converter 50 including a linear capacitor array 54 is shown. The linear capacitor array 54 includes $2^N-1$ capacitors that are selectively switched between a voltage reference and reference potential such as ground. While the linear capacitor array 54 inherently monotonic, the number of switches required grows exponentially with the bit resolution. For example, a 16-bit digital to analog converter includes $2^{16}-1$ pairs of switches, which may be impractical.

SUMMARY OF THE INVENTION

A digital-to-analog converter (DAC) comprises a capacitive DAC that comprises N first capacitances that are connected in parallel and that have first ends and second ends, wherein N is an integer greater than one, and N first switches that selectively connect a selected one of the second ends of the N first capacitances to a common node and non-selected ones of the second ends of the N first capacitances to one of a voltage potential and a reference potential. Capacitance values of the N first capacitances are substantially equal. A second DAC communicates with the common node.

A digital-to-analog converter (DAC) comprises first converting means for converting a digital signal to an analog signal and that comprises N first capacitance means for providing capacitance that are connected in parallel and that have first ends and second ends, wherein N is an integer greater than one and N first switching means for selectively connecting one of the second ends of the N first capacitance means to a common node and others of the second ends to one of a voltage potential and a reference potential. Capacitance values of the N first capacitance means are substantially equal. Second converting means converts a digital signal to an analog signal and that communicates with the common node.

A method for providing a digital-to-analog converter (DAC) comprises connecting N first capacitances of a first capacitive DAC in parallel, wherein the N first capacitances have first ends and second ends, N is an integer greater than one, and capacitance values of the N first capacitances are substantially equal. The method includes selectively connecting a selected one of the second ends of the N first capacitances to a common node; selectively connecting others of the second ends to one of a voltage potential and a reference potential; and connecting a second DAC to the common node.

A pipelined analog-to-digital converter (ADC) comprises a first stage that receives an input voltage signal and that comprises an analog-to-digital converter (ADC) that includes an amplifier having an input and an output; N capacitances that are connected in parallel and that include first ends that selectively communicate with the input and second ends; N switches that selectively connect the second ends of the N capacitances to the voltage input during a first phase, one of the second ends of the N capacitances to the output of the amplifier during a second phase, and others of the second ends of the N capacitances to one of a voltage reference and a reference potential during the second phase. A second stage communicates with the output the amplifier.

In other features, the first phase is a sampling phase and the second phase is a residue amplification phase. When the input voltage is between zero and a first ratio of a first of the N capacitances divided by a sum of the N capacitances, the first of the N capacitances is connected to the output of the amplifier and others of the N capacitances are connected to the reference potential during the second phase. When the input voltage is between the first ratio and a second ratio of a sum of the first and a second of the N capacitances divided by a sum of the N capacitances, the first of the N capacitances is connected to the voltage reference, the second of the N capacitances is connected to the output of the amplifier and others of the N capacitances are connected to the reference potential during the second phase. When the input voltage is between the second ratio and a third ratio of a sum of the first, the second and a third of the N capacitances divided by a sum of the N capacitances, the first and the second of the N capacitances are connected to the voltage reference, the third of the N capacitances is connected to the output of the amplifier and others of the N capacitances are connected to the reference potential during the second phase.

A pipelined analog-to-digital converter (ADC) comprises first stage means for receiving an input voltage signal and that comprises converting means for converting signals that includes: amplifying means for amplifying and having an input and an output; N capacitance means for providing capacitance, that are connected in parallel and that include first ends that selectively communicate with the input and second ends; and N switching means for selectively connecting the second ends of the N capacitance means to the voltage input during a first phase, one of the second ends of the N capacitance means to the output of the amplifier during a second phase, and others of the second ends of the N capacitance means to one of a voltage reference and a reference potential during the second phase; and second stage means for communicating with the output of the amplifying means of the first stage means.

In other features, the first phase is a sampling phase and the second phase is a residue amplification phase. When the input voltage is between zero and a first ratio of a first of the N capacitances divided by a sum of the N capacitances, the N switching means connect the first of the N capacitances to the output of the amplifier and others of the N capacitances to the reference potential during the second phase. When the input voltage is between the first ratio and a second ratio of a sum of the first and a second of the N capacitances divided by a sum of the N capacitances, the N switching means connect the first of the N capacitances to the voltage reference, the second of the N capacitances to the output of the amplifier and others of the N capacitances to the reference potential during the second phase. When the input voltage is between the second ratio and a third ratio of a sum of the first, the second and a third of the N capacitances divided by a sum of the N capacitances, the N switching means connect the first and the second of the N capacitances to the voltage reference, the third of the N capacitances to the output of the amplifier and others of the N capacitances to the reference potential during the second phase.

A method for generating a residue voltage in a pipelined analog-to-digital converter (ADC) comprises providing first and second stages, wherein the first stage receives a voltage input and includes a capacitive ADC including N capacitances; selectively connecting the second ends of the N capacitances to the voltage input during a first phase; selectively connecting one of the second ends of the N capacitances to the output of the amplifier during a second phase; selectively connecting others of the second ends of the N capacitances to one of a voltage reference and a reference potential during the second phase; selectively connecting the first ends of the N capacitances to an amplifier input; and connecting an amplifier output to the second stage.

In other features, the first phase is a sampling phase and the second phase is a residue amplification phase. The method further comprises selectively connecting the first of the N capacitances to the output of the amplifier and others of the N capacitances to the reference potential during the second phase when the input voltage is between zero and a first ratio of a first of the N capacitances divided by a sum of the N capacitances. The method further comprises selectively connecting the first of the N capacitances to the voltage reference, the second of the N capacitances to the output of the amplifier and others of the N capacitances to the reference potential during the second phase when the input voltage is between the first ratio and a second ratio of a sum of the first and a second of the N capacitances divided by a sum of the N capacitances. The method further comprises selectively connecting the first and the second of the N capacitances to the voltage reference, the third of the N capacitances to the output of the amplifier and others of the N capacitances to the reference potential during the second phase when the input voltage is between the second ratio and a third ratio of a sum of the first, the second and a third of the N capacitances divided by a sum of the N capacitances.

A digital to analog converter (DAC) comprises X capacitive DACs that are connected in series and wherein X is an integer greater than one. Each of the X capacitive DACs comprise M switches wherein M is an integer greater than one; a signal input; a signal output; and M capacitances that communicate with the M switches, respectively, and that have first and second ends and substantially equal capacitance values. The M switches selectively connect the first ends of the M capacitances to the signal output. The M switches connect the second end of a selected one of the M capacitances to the signal input. A first DAC has a signal output that communicates with the signal input of one of the X capacitive DACs.

In other features, an amplifier has an input and an output. A feedback capacitance communicates with the input and the output of the amplifier. The first ends of the M capacitances of another one of the X DACs communicates with a reference potential during a first phase of the another one of the X DACs. The input of the amplifier selectively communicates with the first ends of the M capacitances of the another one of the X DACs during a second phase of the another one of the X DACs.

In other features, an amplifier has an input and an output. The first ends of the M capacitances of another one of the X DACs communicate with a reference potential during a first phase of the another one of the X DACs. The input of the amplifier selectively communicates with the first ends of the M capacitances of the another one of the X DACs during a second phase of the another one of the X DACs. The second ends of the of the M capacitances of the another one of the X DACs communicate with the output of the amplifier during the second phase of the another one of the X DACs. The first DAC comprises Y resistive DACs wherein Y is an integer greater than zero.

In other features, at least one of the Y resistive DACs comprises a signal output; N resistances connected in series between the voltage reference and the reference potential; N nodes between select ones of the N resistances and the reference potential; and N second switches that selectively connect the signal output of the one of the Y resistive DACs to one of the N nodes. A control module selectively generates switching signals to control the X capacitive DACs and the first DAC.

In other features, a successive approximation analog-to-digital converter comprises the DAC. The successive approximation analog-to-digital converter of comprises an amplifier having an input that selectively communicates with one of the X capacitive DACs. A successive approximation module communicates with an output of the amplifier. A decoding module communicates with an output of the successive approximation module and selectively generates switching signals for the X capacitive DACs and the first DAC.

In other features, the first DAC comprises a capacitive DAC. The capacitive DAC comprises a signal output and an amplifier having an input and an output that communicates with the signal output. M second capacitances are connected in parallel and have first ends and second ends. The first ends selectively communicate with a reference potential during a first phase of the capacitive DAC. The first ends selectively communicate with the input of the amplifier during a second phase of the capacitive DAC. M second switches selectively connect the second ends of the M second capacitances to one of the voltage reference and the reference potential during the first phase of the capacitive DAC and selectively connect the second ends of the M second capacitances to the output during the second phase of the capacitive DAC.

A digital to analog converter (DAC) comprises X capacitive converting means for converting a digital signal to an analog signal and that are connected together in series and wherein X is an integer greater than one. Each of the X capacitive converting means comprise M switching means for switching wherein M is an integer greater than one. M capacitance means for providing capacitance communicate with the M switching means, respectively, and have first and second ends and substantially equal capacitance values. The M switching means selectively connect the first ends of the M capacitance means to the signal output. The M switching means connect the second end of a selected one of the M capacitance means to the signal input. First converting means converts a digital signal to an analog signal and has a signal output that communicates with the signal input of one of the X capacitive converting means.

In other features, amplifying means for amplifying and has an input and an output. Feedback capacitance means provides capacitance and communicates with the input and the output of the amplifying means. The first ends of the M capacitance means of another one of the X converting means communicates with a reference potential during a first phase of the another one of the X converting means. The input of the amplifying means selectively communicates with the first ends of the M capacitance means of the another one of the X converting means during a second phase of the another one of the X converting means.

In other features, amplifying means for amplifying has an input and an output. The first ends of the M capacitance means of another one of the X converting means communicates with a reference potential during a first phase of the another one of the X converting means. The input of the amplifying means selectively communicates with the first ends of the M capacitance means of the another one of the X converting means during a second phase of the another one of the X converting means. The second ends of the M capacitance means of the another one of the X converting means communicate with the output of the amplifying means during the second phase of the another one of the X converting means. The first DAC comprises Y resistive converting means for converting a digital signal to an analog signal and wherein Y is an integer greater than zero.

In other features, at least one of the Y resistive converting means comprises a signal output and N resistance means for providing resistance and that is connected in series between the voltage reference and the reference potential. N nodes are located between select ones of the N resistance means and the reference potential. N second switching means selectively connect the signal output of the one of the Y resistive converting means to one of the N nodes. Control means selectively generates switching signals to control the X capacitive converting means and the first DAC.

In other features, a successive approximation analog-to-digital converter comprises the DAC. The successive approximation analog-to-digital converter comprises amplifying means for amplifying and having an input that selectively communicates with one of the X capacitive DACs and approximation means for successive approximating and that communicates with an output of the amplifying means. Decoding means communicates with an output of the successive approximation module for selectively generating switching signals for the X capacitive DACs and the first DAC.

In other features, the first DAC comprises a capacitive converting means for converting a digital signal to an analog signal. The capacitive converting means comprises a signal output and amplifying means for amplifying and having an input and an output that communicates with the signal output. M second capacitance means provides capacitance and is connected in parallel and has first ends and second ends. The first ends selectively communicate with a reference potential during a first phase of the capacitive DAC. The first ends selectively communicate with the input of the amplifying means during a second phase of the capacitive DAC. M second switching means selectively connect the second ends of the M second capacitance means to one of the voltage reference and the reference potential during the first phase of the capacitive DAC and selectively connect the second ends of the M second capacitance means to the output during the second phase of the capacitive DAC.

A method for operating a digital to analog converter (DAC) comprises connecting X capacitive DACs in series and wherein X is an integer greater than one, wherein each of the X capacitive DACs comprise M capacitances that have first and second ends and substantially equal capacitance values; selectively connecting the first ends of the M capacitances to the signal output; connecting the second end of a selected one of the M capacitances to the signal input; and connecting a signal output of a first DAC to the signal input of one of the X capacitive DACs.

In other features, the method comprises providing an amplifier having an input and an output and a feedback capacitance that communicates with the input and the output of the amplifier. The method comprises connecting the first ends of the M capacitances of another one of the X DACs with a reference potential during a first phase of the another one of the X DACs. The method comprises selectively connecting the input of the amplifier to the first ends of the M capacitances of the another one of the X DACs during a second phase of the another one of the X DACs.

In other features, the method comprises providing an amplifier having an input and an output; selectively connecting the first ends of the M capacitances of another one of the X DACs with a reference potential during a first phase of the another one of the X DACs; selectively connecting the input of the amplifier with the first ends of the M capacitances of the another one of the X DACs during a second phase of the another one of the X DACs; and selectively connecting the second ends of the of the M capacitances of the another one of the X DACs communicate with the output of the amplifier during the second phase of the another one of the X DACs.

In other features, the first DAC comprises Y resistive DACs wherein Y is an integer greater than zero. The method comprises selectively generating switching signals to control the X capacitive DACs and the first DAC. The method comprises using the X capacitive DACs to successively approximate an analog input signal. The first DAC comprises a capacitive DAC.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4C is an exemplary truth table for the circuit of FIG. 3B;

FIG. 4D is an exemplary truth table for the circuit of FIG. 3C;

FIG. 8E illustrates the D/A converter of FIG. 8B during a sampling phase for a second digital value;

FIG. 8F illustrates the D/A converter of FIG. 8B during a sampling phase for a third digital value;

FIG. 8J is an exemplary truth table for the D/A converter of FIG. 8B;

FIG. 12A illustrates an A/D converter that generates an ideal residue voltage according to the present invention;

FIG. 12B illustrates the A/D converter of FIG. 12A in a sampling phase;

DETAILED DESCRIPTION OF THE PREFERRED EMBODIMENTS

Figure 1A:
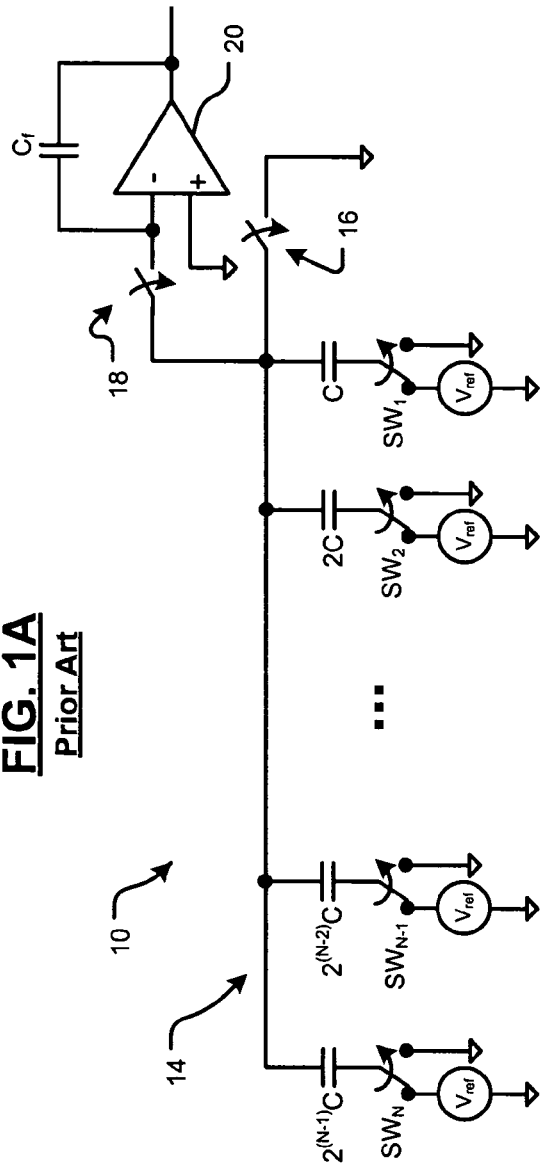
FIG. 1A is an electrical schematic of a binary capacitor array D/A converter according to the prior art.
Figure 1B:
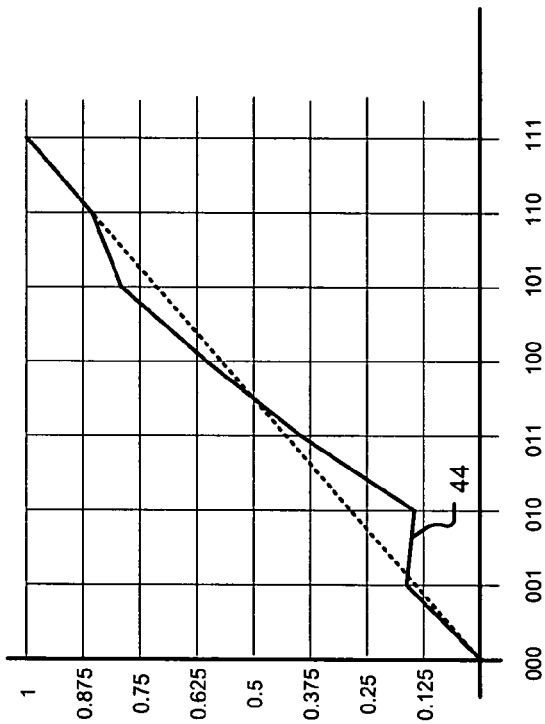
FIG. 1B is a graph of a D/A converter.
Figure 2:
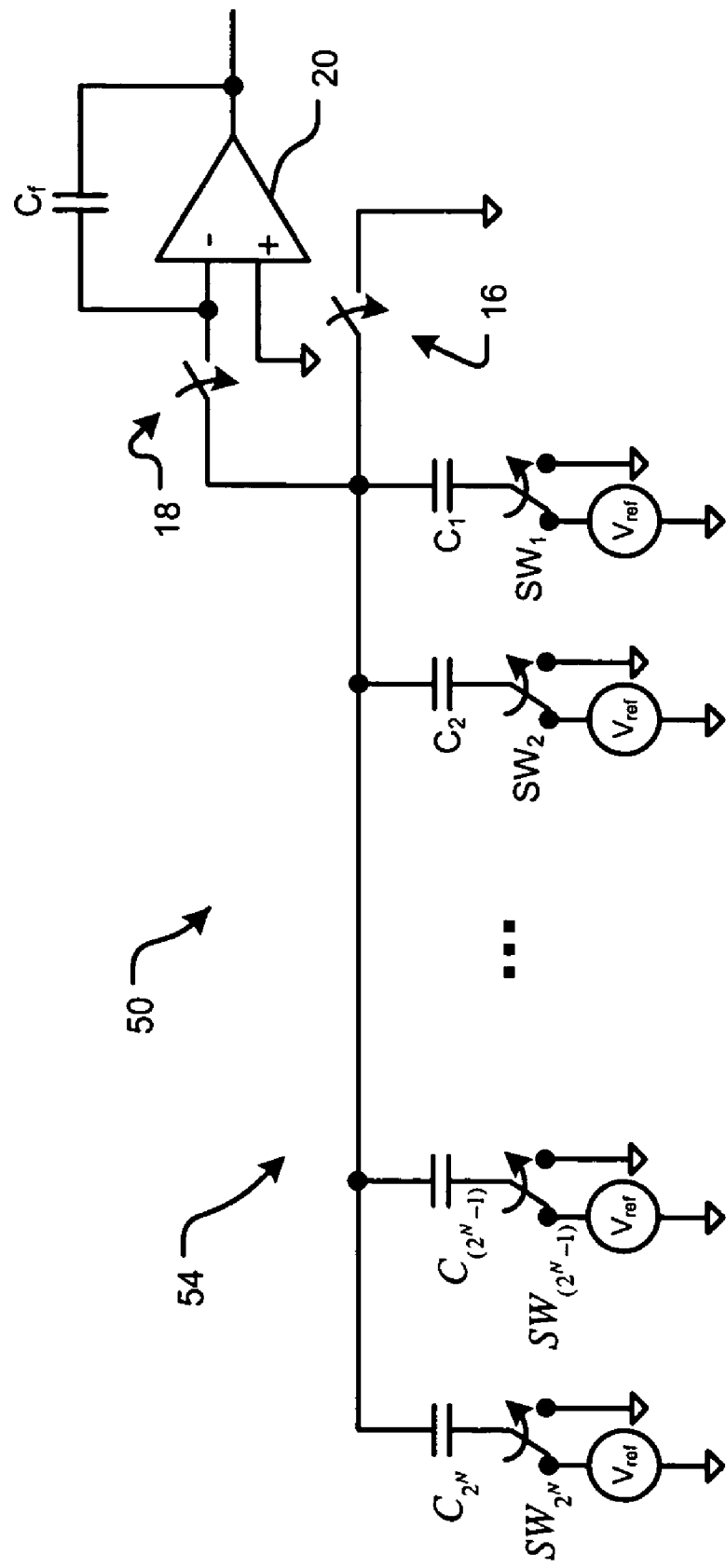
FIG. 2 is an electrical schematic of a linear capacitor array D/A converter according to a prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Figure 3A:
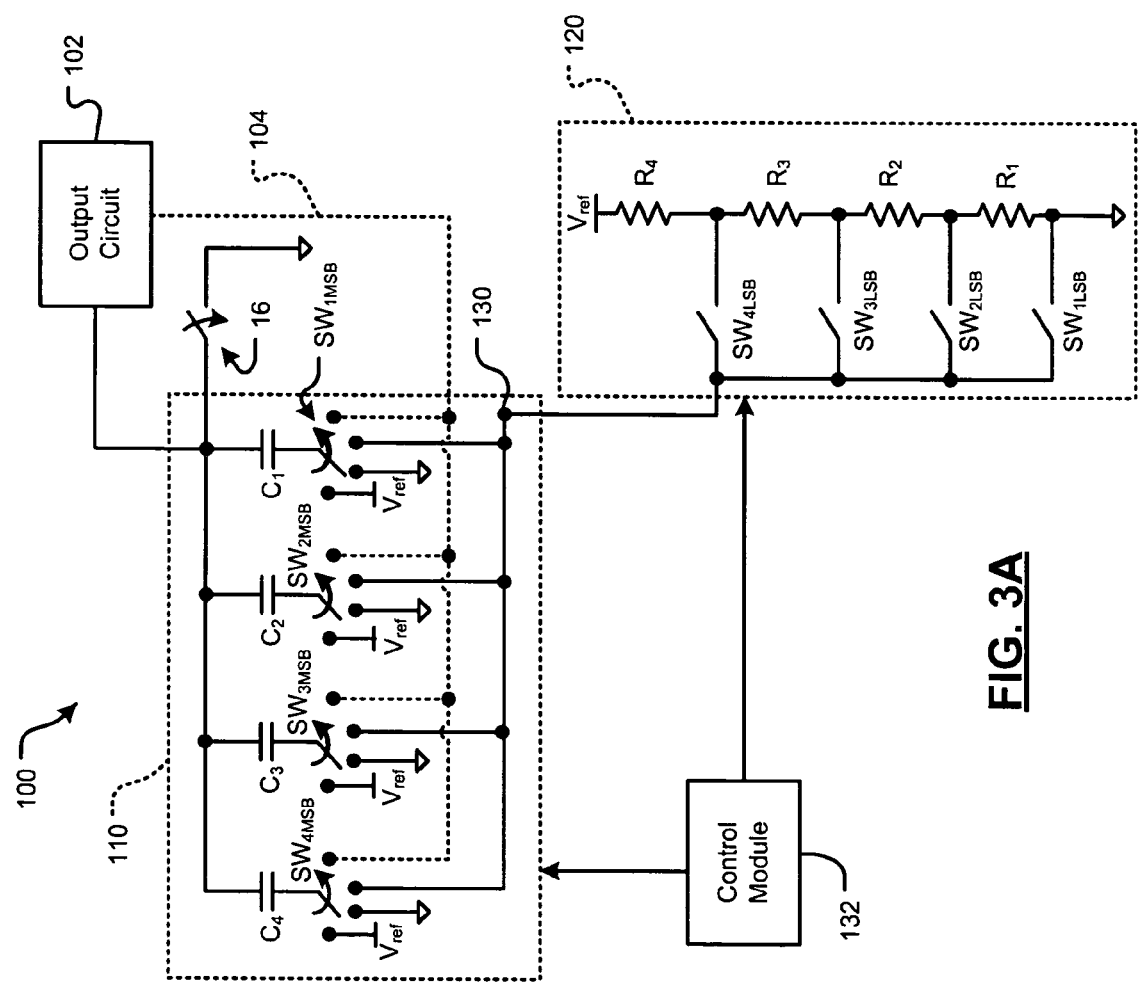
FIGS. 3A-3C are electrical schematics of a capacitive-resistive D/A converter in exemplary configurations.
Figure 3B:
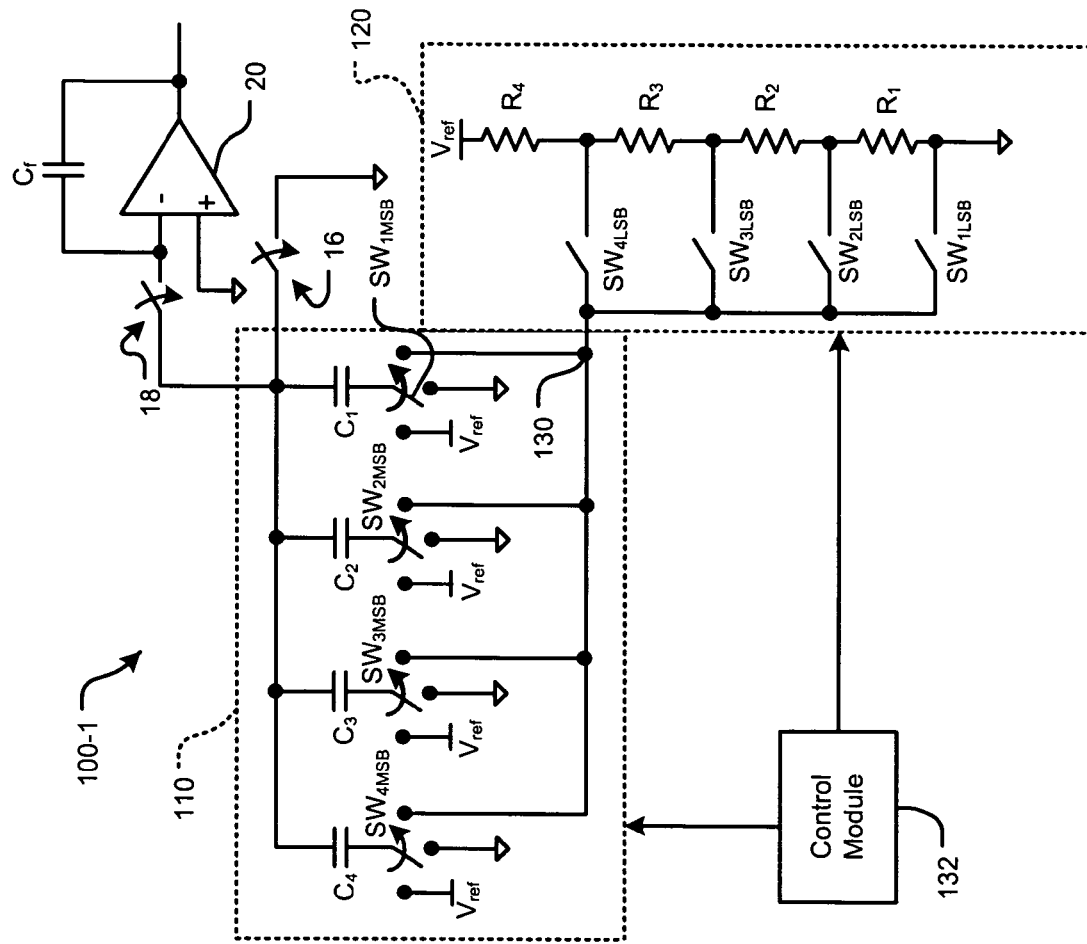
Figure 3C:
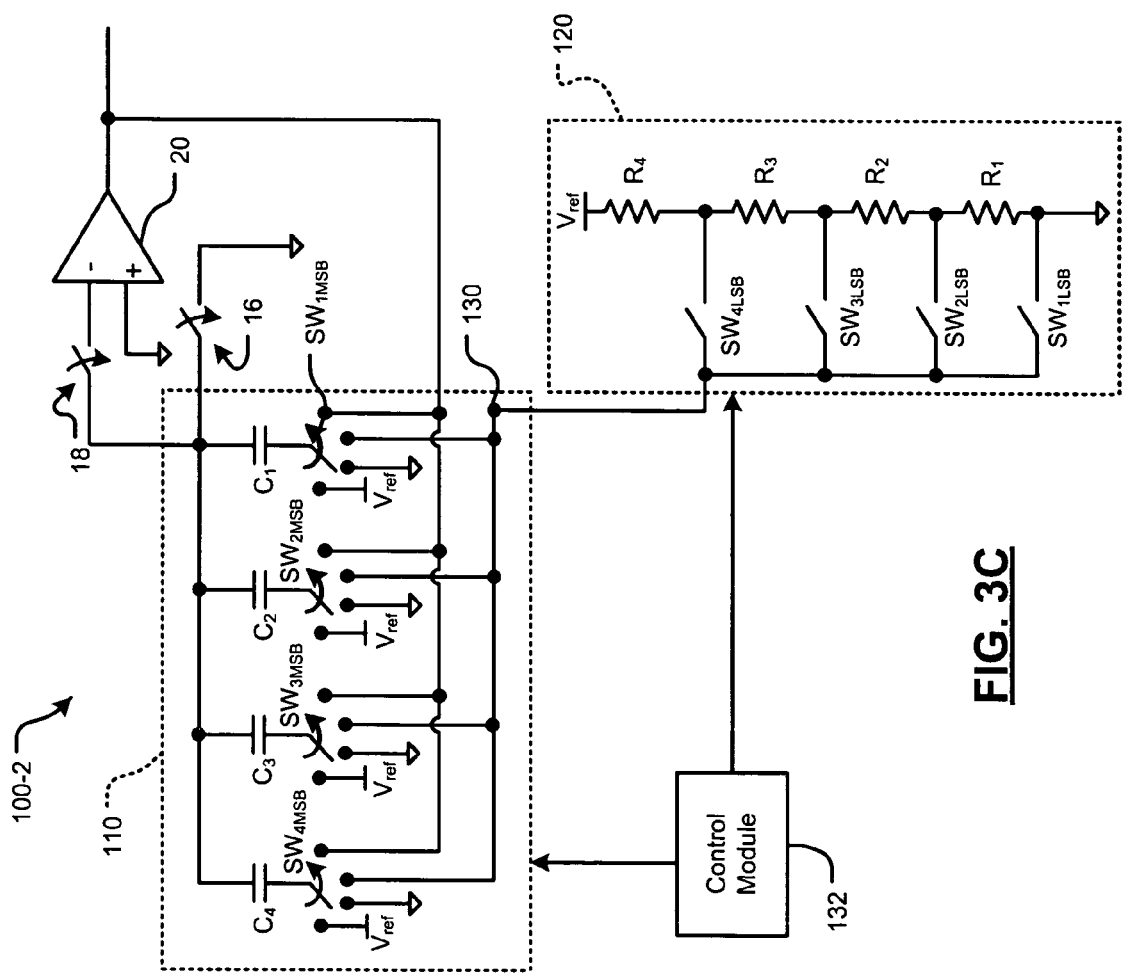

Referring now to FIGS. 3A and 3B, capacitive-resistive D/A converters 100, 100-1 and 100-2 are shown. For simplicity, an N=4 bit example is shown in FIGS. 3A-3C. Skilled artisans will appreciate that N can be set to other numbers of bits. Various types of output circuits 102 may be used. Additional connections 104, which may or may not be switched connections, may be used depending upon the function that is desired. For example in FIG. 3B, the DAC 100-1 is shown in a sample and integrate configuration and in FIG. 3C, a DAC 100-2 is shown with a sample and hold configuration.

In this example, the two most significant bits (MSBs) are allocated to a capacitive portion 110 and the two least significant bits (LSBs) are allocated to a resistive portion 120. In the Figures that follow, the capacitor C, will be shown with dotted lines to indicate both sample and hold and sample and integrate configurations.

The capacitive portion 110 includes capacitors $C_1$, $C_2$, $C_3$ and $C_4$. In the preferred embodiment, the capacitors $C_1$, $C_2$, $C_3$ and $C_4$ have a substantially equal capacitance value. The capacitors may have substantially the same capacitance value, in other words $C_1=C_2=C_3=C_4$. As will be described further below, the capacitors are selectively switched by switches $SW_{4MSB}$, $SW_{3MSB}$, $SW_{2MSB}$, and $SW_{1MSB}$ (collectively switches $SW_M$) between a voltage reference $V_{ref}$, a reference potential such as ground, and a common node 130 between the resistive portion 120 and the capacitive portion 110.

The resistive portion 110 includes resistors $R_1$, $R_2$, $R_3$ and $R_4$. In the preferred embodiment, the resistors $R_1$, $R_2$, $R_3$ and $R_4$ have a substantially equal resistance value. The resistors may have the same resistance value, in other words $R_1=R_2=R_3=R_4$. As will be described further below, the resistors are connected in series between $V_{ref}$ and a reference potential such as ground. A node between the resistors is selected by switches $SW_{4LSB}$, $SW_{3LSB}$, $SW_{2LSB}$, and $SW_{1LSB}$ (collectively switches $SW_L$) and connected to the common node 130 to create a voltage divider.

The sample and integrate circuit was described above. In the sample and hold configuration, the second ends of the capacitances $C_1$, $C_2$, $C_3$ and $C_4$ are switched to the output of the amplifier during the second phase of the capacitive portion 110. The feedback capacitance $C_f$ may be omitted.

Figure 4B:
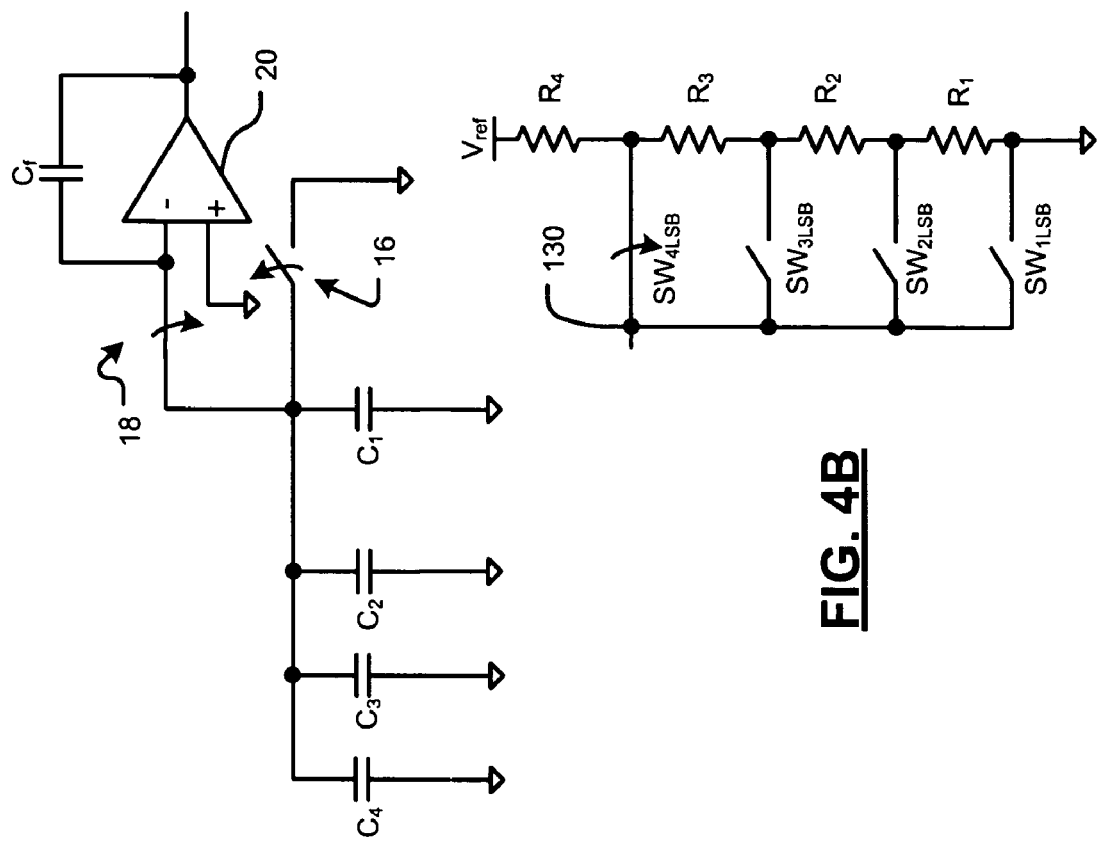
FIG. 4B illustrates the D/A converter of FIG. 3B during an integrating phase for a first digital value.
Figure 4A:
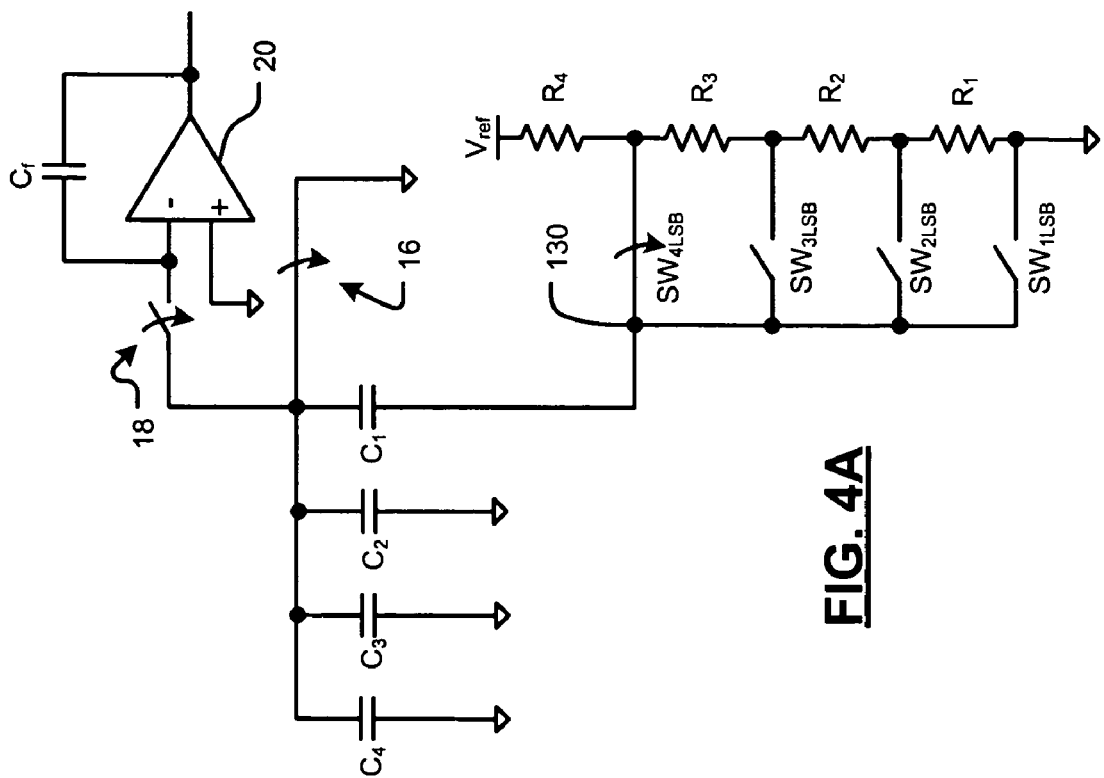
FIG. 4A illustrates the D/A converter of FIG. 3B during a sampling phase for a first digital value.

Referring now to FIG. 4A, the D/A converter of FIG. 3B is shown during a sampling phase for a first digital value (0011). Initially, the switch 16 is closed, the switch 18 is opened and the capacitors $C_2$, $C_3$ and $C_4$ are switched by respective switches to the reference potential, which may be ground. The capacitor $C_1$ is connected to the common node. The capacitive portion 110 will be in this configuration when the desired binary value is between 0000 and 0011. One of the resistive switches $SW_{4LSB}$, $SW_{3LSB}$, $SW_{2LSB}$, and $SW_{1LSB}$ is closed to create a voltage divider. In the example shown in FIG. 4A, the switch $SW_{4LSB}$ is closed to provide $$\frac{3}{4}V_{ref}.$$

A charge is accumulated on the capacitor $C_1$ that is equal to $V_{RDAC}C_1$, where $V_{RDAC}$ is the voltage provided by the resistive portion 120.

Referring now to FIG. 4B, the D/A converter of FIG. 3B is shown during an integrating phase for the first digital value (0011). In this phase, the switch 16 is opened, the switch 18 is closed and the voltage value is applied to the amplifier 20. Using a charge equalization approach, the total charge before changing the position of the switches 16 and 18 is equal to the total charge after changing the position of the switches 16 and 18:

$$Q_T = VC_f = V_{RDAC}C_1; V = V_{RDAC}\frac{C_1}{C_f}.$$

The value of $C_f$ can be set equal to $C_1$, $C_2$, $C_3$ and $C_4$ or be used to scale the output voltage and not be equal to $C_1$, $C_2$, $C_3$ and $C_4$. In the example above, $$V_{RDAC} = \frac{3}{4}V_{ref}.$$

As can be appreciated, the value can also be adjusted to $$V_{RDAC} = 0, V_{RDAC} = \frac{1}{4}V_{ref}, \text{ or } V_{RDAC} = \frac{1}{2}V_{ref}$$

by selecting the switch $SW_{1LSB}$, $SW_{2LSB}$ or $SW_{3LSB}$, respectively. Scaling can be performed by adjusting the value of $C_f$ relative to $C_1$, $C_2$, $C_3$ and $C_4$. For example, if $Cf=C_1+C_2+C_3+C_4$, then the output ranges 0 to near $V_{ref}$ rather than 0 to near $4V_{ref}$ in this example.

Figures 4C, 4D:
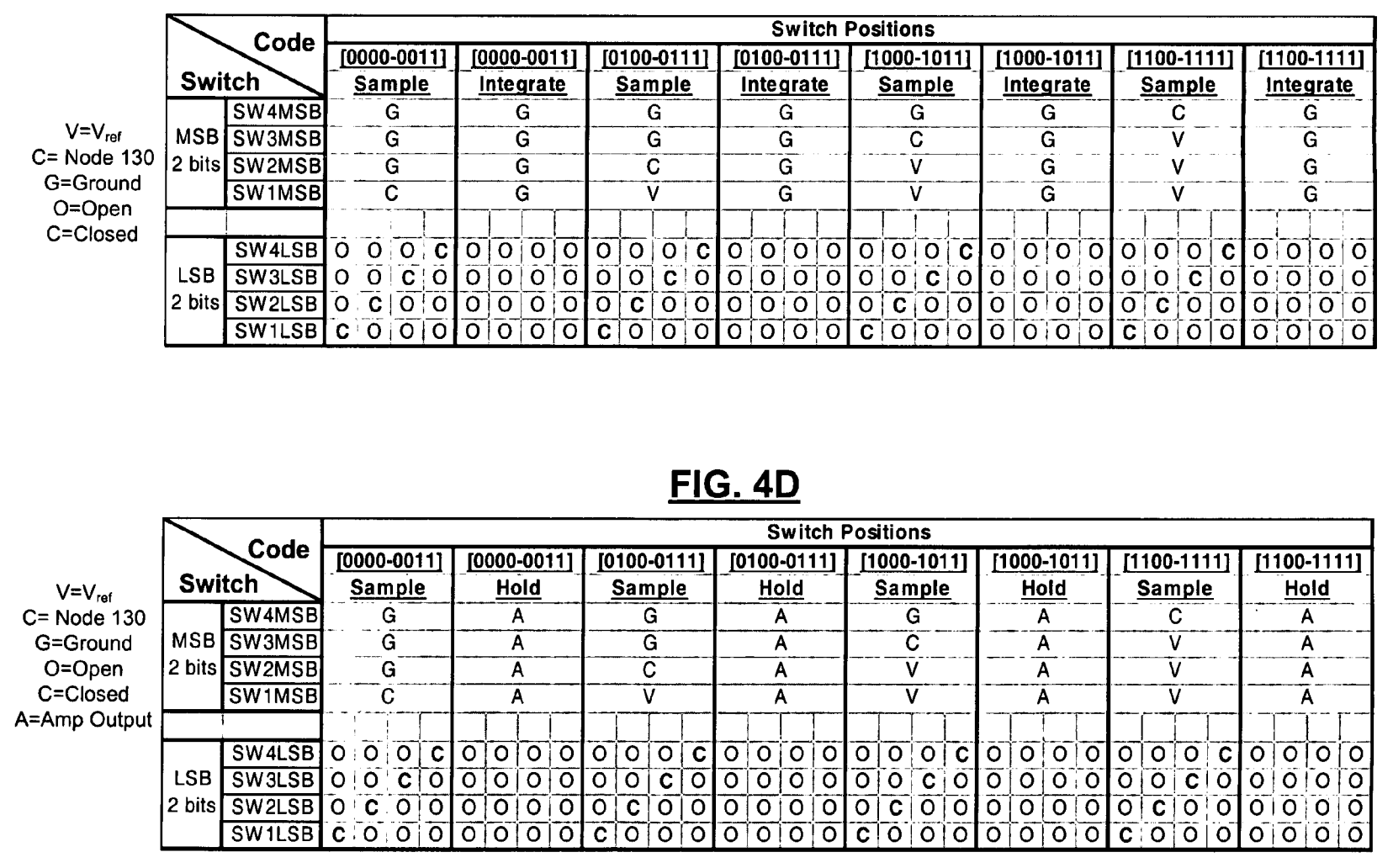

Referring now to FIG. 4C, a truth table for the exemplary converter of FIG. 3B is shown. In this example, $C_f$ is equal to $C_1$, $C_2$, $C_3$ and $C_4$ although other values may be used for scaling. Referring now to FIG. 4D, a truth table for the exemplary converter of FIG. 3C is shown.

Figure 5:
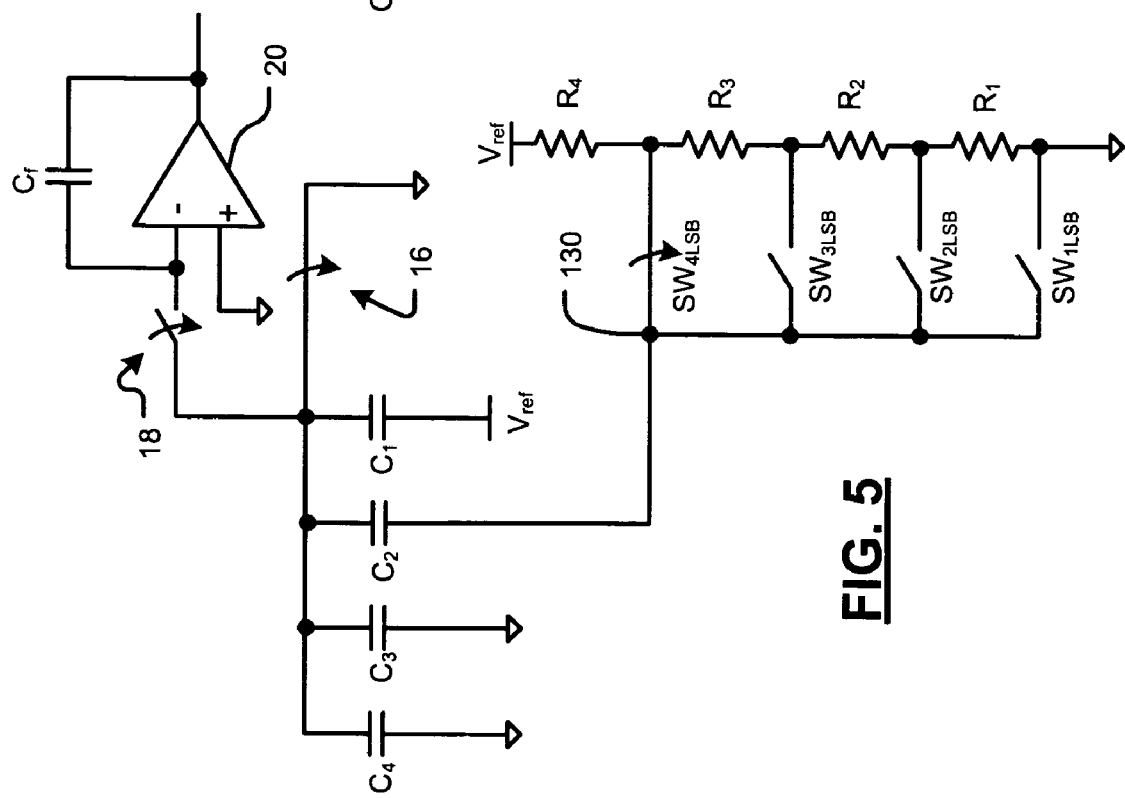
FIG. 5 illustrates the D/A converter of FIG. 3B during a sampling phase for a second digital value.

Referring now to FIG. 5, the D/A converter of FIG. 3B is shown during an integrating phase for a second digital value (0111). Initially, the switch 16 is closed, the switch 18 is opened and the capacitors $C_3$ and $C_4$ are switched by respective switches to the reference potential, which may be ground. The capacitor $C_2$ is connected to the common node 130 and the capacitor $C_1$ is connected to $V_{ref}$. The capacitive portion 110 will be in this configuration when the desired binary value is between 0100 and 0111. One of the resistive switches $SW_{4LSB}$, $SW_{3LSB}$, $SW_{2LSB}$, and $SW_{1LSB}$ is closed to create a voltage divider. In the example shown in FIG. 5, the switch $SW_{4LSB}$ is closed to provide $$\frac{3}{4}V_{ref}.$$

A charge is accumulated on the capacitor $C_2$ that is equal to $V_{RDAC}C_2$, where $V_{RDAC}$ is the voltage provided by the resistive portion. A charge is also accumulated on capacitor $C_1$ equal to $V_{ref}C_1$.

During an integrating phase for the second digital value (0111) the switch 16 is opened, the switch 18 is closed and the voltage value is applied to the amplifier 20. Using a charge equalization approach, the total charge before changing the position of the switches 16 and 18 is equal to the total charge after changing the position of the switches 16 and 18:

$$Q_T = VC_f = V_{RDAC}C_2 + V_{ref}C_1; V = V_{RDAC}\frac{C_2}{C_f} + V_{ref}\frac{C_1}{C_f}.$$

The value of $C_f$ can be set equal to $C_1$, $C_2$, $C_3$ and $C_4$ or be used to scale the output voltage and not be equal to $C_1$, $C_2$, $C_3$ and $C_4$. If $C_f$, $C_1$ and $C_2$ are the same, $V=V_{RDAC}+V_{ref}$.

Figure 6:
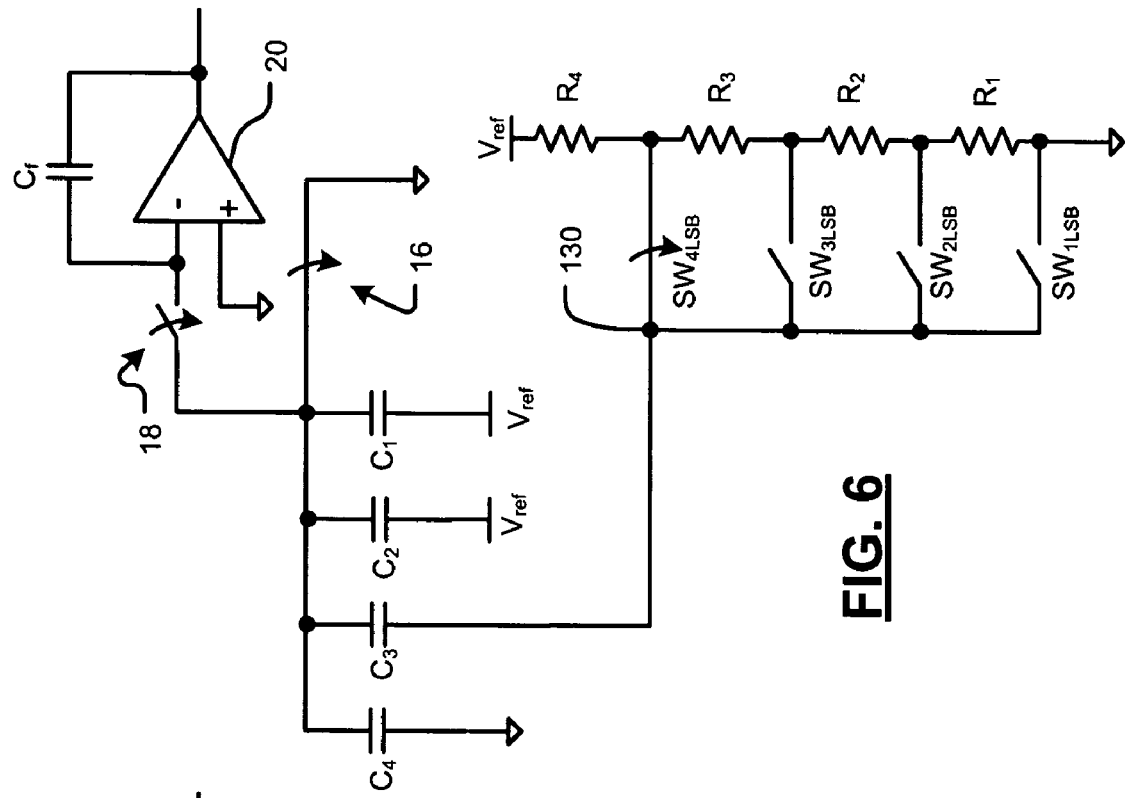
FIG. 6 illustrates the D/A converter of FIG. 3B during a sampling phase for a third digital value.

Referring now to FIG. 6, the D/A converter of FIG. 3B is shown during an integrating phase for a third digital value (1011). Initially, the switch 16 is closed, the switch 18 is opened and the capacitor $C_4$ is switched by a respective switch to the reference potential, which may be ground. The capacitor $C_3$ is connected to the common node 130 and the capacitors $C_1$ and $C_2$ are connected to $V_{ref}$. The capacitive portion 110 will be in this configuration when the desired binary value is between 1000 and 1011. One of the resistive switches $SW_{4LSB}$, $SW_{3LSB}$, $SW_{2LSB}$, and $SW_{1LSB}$ is closed to create a voltage divider. In the example shown in FIG. 6, the switch $SW_{4LSB}$ is closed to provide $$\frac{3}{4}V_{ref}.$$

A charge is accumulated on the capacitor $C_3$ that is equal to $V_{RDAC}C_3$, where $V_{RDAC}$ is the voltage provided by the resistive portion. A charge is also accumulated on capacitors $C_1$ and $C_2$ that is equal to $V_{ref}(C_1+C_2)$.

During an integrating phase for the third digital value (1011) the switch 16 is opened, the switch 18 is closed and the voltage value is applied to the amplifier 20. Using a charge equalization approach, the total charge before changing the position of the switches 16 and 18 is equal to the total charge after changing the position of the switches 16 and 18:

$$Q_T = VC_f = V_{RDAC}C_3 + V_{ref}(C_1 + C_2); V = V_{RDAC}\frac{C_3}{C_f} + V_{ref}\frac{C_1 + C_2}{C_f}.$$

The value of $C_f$ can be set equal to $C_1, C_2, C_3$ and $C_4$ or be used to scale the output voltage and not be equal to $C_1, C_2, C_3$ and $C_4$. If $C_f, C_1, C_2$ and $C_3$ are the same, $V=V_{RDAC}+2V_{ref}$.

Figure 7:
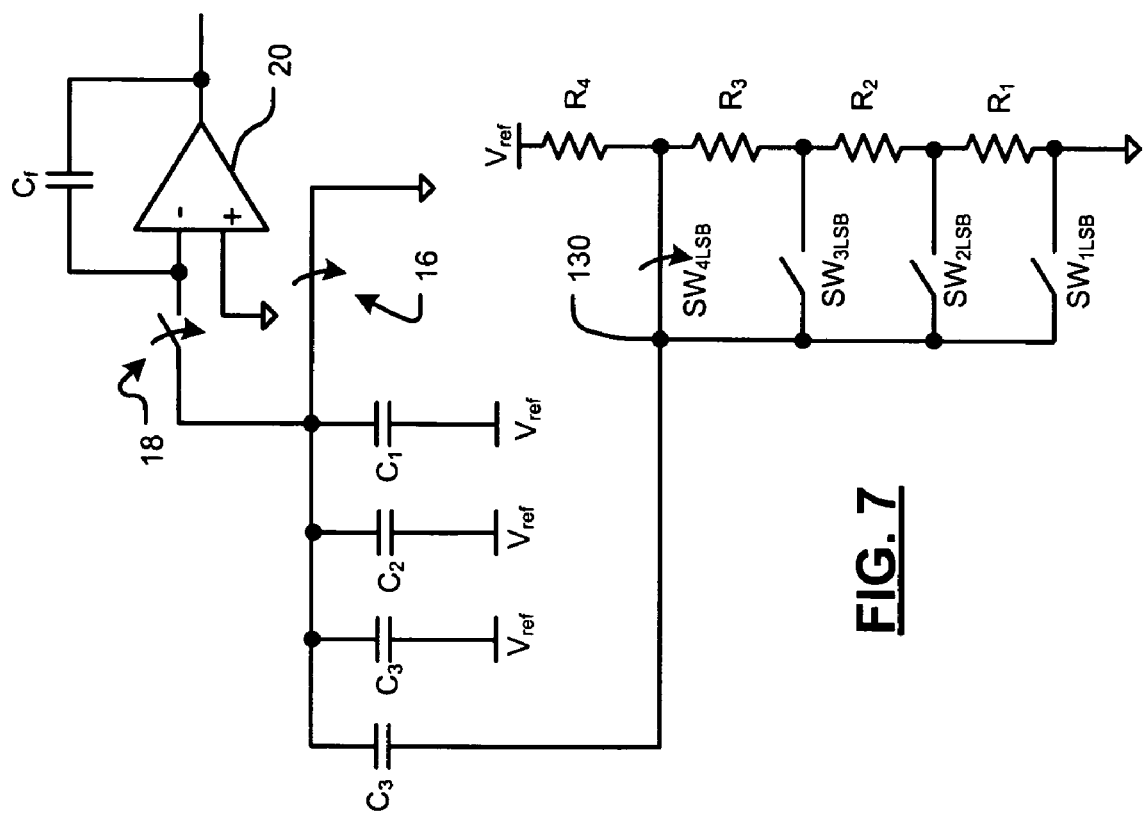
FIG. 7 illustrates the D/A converter of FIG. 3B during a sampling phase for a fourth digital value.

Referring now to FIG. 7, the D/A converter of FIG. 3B is shown during an integrating phase for a third digital value (1111). Initially, the switch 16 is closed and the switch 18 is opened. The capacitor $C_4$ is connected to the common node 130 and the capacitors $C_1, C_2$ and $C_3$ are connected to $V_{ref}$. The capacitive portion 110 will be in this configuration when the desired binary value is between 1100 and 1111. One of the resistive switches $SW_{4LSB}, SW_{3LSB}, SW_{2LSB}$, and $SW_{1LSB}$ is closed to create a voltage divider. In the example shown in FIG. 7, the switch $SW_{4LSB}$ is closed to provide $$\frac{3}{4}V_{ref}.$$

A charge is accumulated on the capacitor $C_4$ that is equal to $V_{RDAC}C_4$, where $V_{RDAC}$ is the voltage provided by the resistive portion. A charge is accumulated on capacitors $C_1, C_2$ and $C_3$ that is equal to $V_{ref}(C_1+C_2+C_3)$.

During an integrating phase for the fourth digital value (1111) the switch 16 is opened, the switch 18 is closed and the voltage value is applied to the amplifier 20. Using a charge equalization approach, the total charge before changing the position of the switches 16 and 18 is equal to the total charge after changing the position of the switches 16 and 18:

$$Q_T = VC_f = V_{RDAC}C_4 + V_{ref}(C_1 + C_2 + C_3);$$
$$V = V_{RDAC}\frac{C_4}{C_f} + V_{ref}\frac{C_1 + C_2 + C_3}{C_f}.$$

The value of $C_f$ can be set equal to $C_1, C_2, C_3$ and $C_4$ or be used to scale the output voltage and not be equal to $C_1, C_2, C_3$ and $C_4$. If $C_f, C_1, C_2, C_3$ and $C_4$ are the same, $V=V_{RDAC}+3V_{ref}$.

Figure 8A:
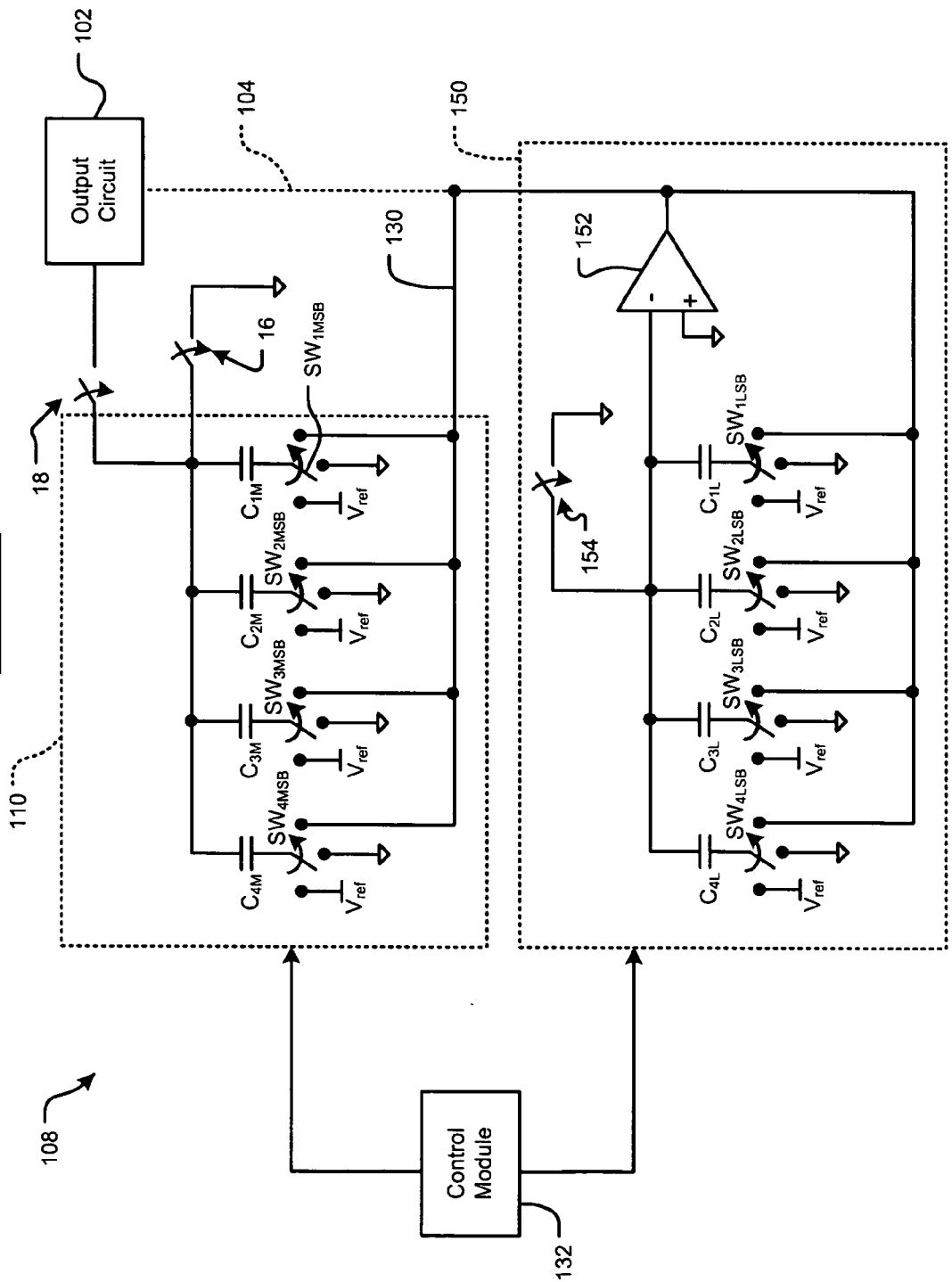
FIG. 8A is an electrical schematic of a capacitive-capacitive D/A converter.
Figure 8B:
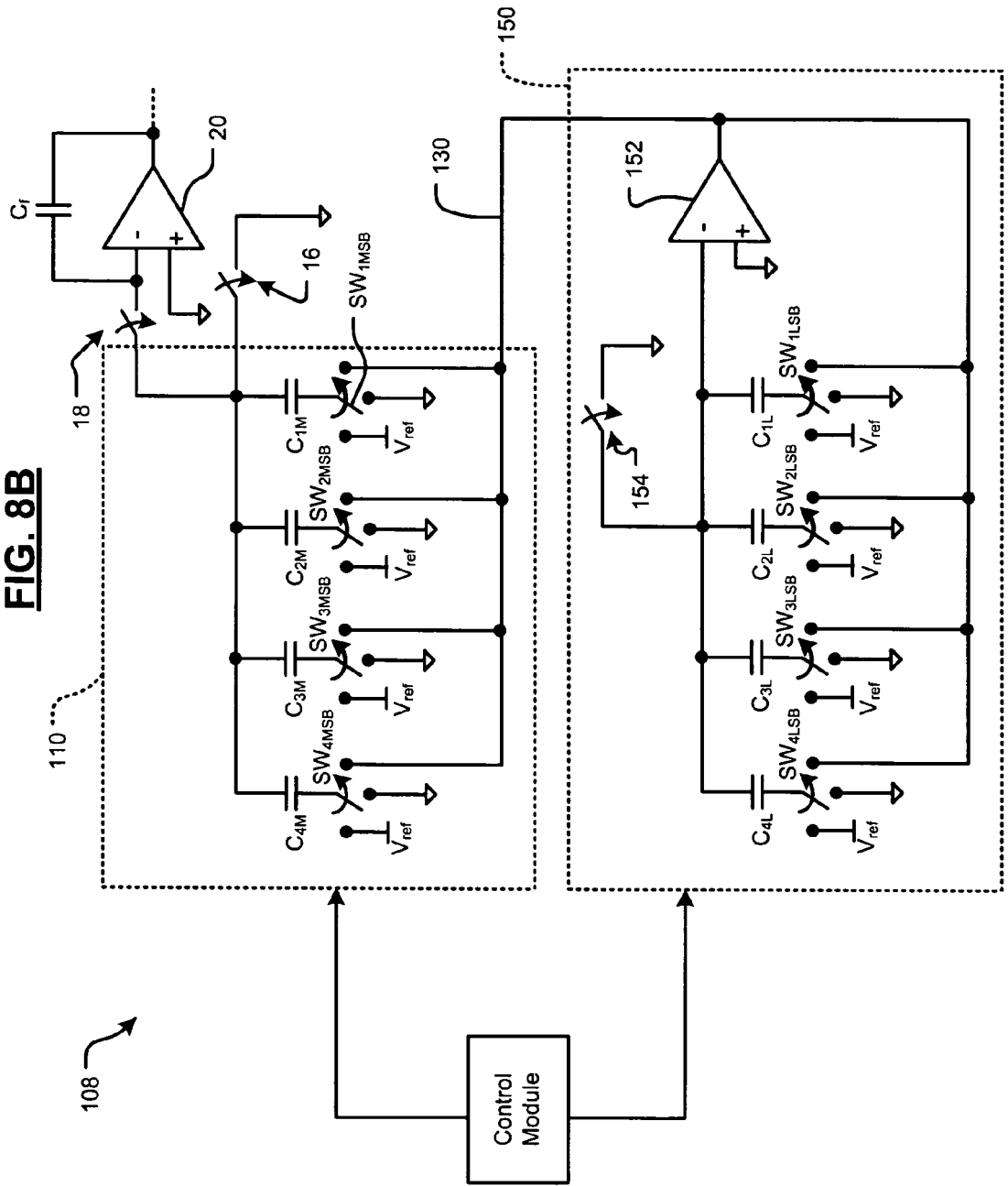
FIG. 8B is an electrical schematic of a capacitive-capacitive D/A converter in a sample and integrate configuration.

Referring now to FIGS. 8A and 8B, a nested segmented capacitive-capacitive D/A converter 108 according to the present invention is shown. In FIG. 8A, the output circuit 102 is shown. In FIG. 8B, an exemplary sample and integrate configuration is shown. The capacitive portion 110 operates as described above. For purposes of clarity, the capacitors $C_1, C_2, C_3$ and $C_4$ have been relabeled $C_{1M}, C_{2M}, C_{3M}$ and $C_{4M}$. A second capacitive portion 150 is associated with the two least significant bits and includes capacitors $C_{1L}, C_{2L}, C_{3L}$ and $C_{4L}$. The voltage provided by the LSB capacitive portion 150 is $V_{CDAC}$. The second capacitive portion 150 also has a sampling and integrating phase as will be described below.

Figure 8C:
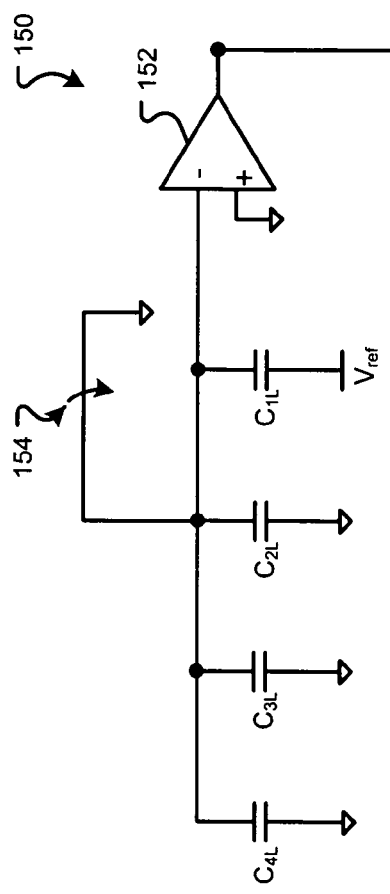
FIG. 8C illustrates the D/A converter of FIG. 8B during a sampling phase for a first digital value.
Figure 8D:
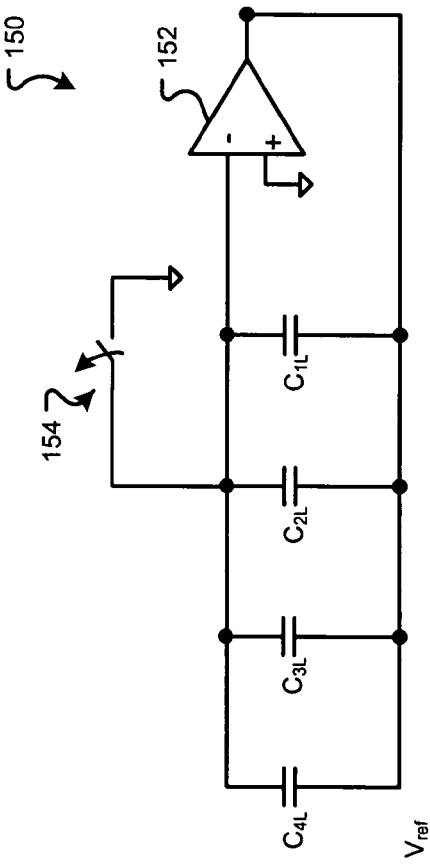
FIG. 8D illustrates the D/A converter of FIG. 8B during an integrating phase for a first digital value.

Referring now to FIGS. 8C and 8D, an equivalent circuit of the D/A converter of FIG. 8B during a sampling phase is shown for $$V_{CDAC} = \frac{V_{ref}}{4}.$$

During sampling phase, the switch 152 is closed and the capacitors $C_{4L}, C_{3L}$ and $C_{2L}$ are connected to a reference potential such as ground. The capacitor $C_{1L}$ is charged to $V_{ref}$. A charge is accumulated on the capacitor $C_{1L}$ that is equal to $V_{ref}C_{1L}$.

During the integrating phase, the switch 152 is opened and the capacitors $C_{4L}, C_{3L}, C_{2L}$ and $C_{1L}$ are connected in feedback. The total charge before the switch 152 is opened is the same as the total charge after the switch 152 is opened. Therefore:

$$Q_T = VC_T = V_{ref}C_{1L} = V(C_{1L} + C_{2L} + C_{3L} + C_{4L});$$
$$V = V_{ref}\frac{C_{1L}}{C_{1L} + C_{2L} + C_{3L} + C_{4L}}.$$

Assuming that $C_{1L}, C_{2L}, C_{3L}$ and $C_{4L}$ are equal, $$V = \frac{V_{ref}}{4}.$$

Referring now to FIG. 8E, an equivalent circuit of the D/A converter of FIG. 8B during a sampling phase is shown for $$V_{CDAC} = \frac{V_{ref}}{2}.$$

During sampling phase, the switch 152 is closed and the capacitors $C_{4L}$ and $C_{3L}$ are connected to a reference potential such as ground. The capacitors $C_{1L}$ and $C_{2L}$ are charged to $V_{ref}$. A charge is accumulated on the capacitors $C_{1L}$ and $C_{2L}$ that is equal to $V_{ref}(C_{1L}+C_{2L})$.

During the integrating phase, the switch 152 is opened and the capacitors $C_{4L}, C_{3L}, C_{2L}$ and $C_{1L}$ are connected in feedback. The total charge before the switch 152 is opened is the same as the total charge after the switch 152 is opened. Therefore:

$$Q_T = VC_T = V_{ref}(C_{1L} + C_{2L}) = V(C_{1L} + C_{2L} + C_{3L} + C_{4L});$$
$$V = V_{ref}\frac{C_{1L} + C_{2L}}{(C_{1L} + C_{2L} + C_{3L} + C_{4L})}.$$

Assuming that $C_1, C_2, C_3$ and $C_4$ are equal, $$V = \frac{V_{ref}}{2}.$$

Referring now to FIG. 8F, an equivalent circuit of the D/A converter of FIG. 8B during a sampling phase is shown for $$V_{CDAC} = \frac{3V_{ref}}{4}.$$

During sampling phase, the switch 152 is closed and the capacitor $C_{4L}$ is connected to a reference potential such as ground. The capacitors $C_{1L}$, $C_{2L}$ and $C_{3L}$ are charged to $V_{ref}$. A charge is accumulated on the capacitors $C_{1L}$, $C_{2L}$ and $C_{3L}$ that is equal to $V_{ref}(C_{1L}+C_{2L}+C_{3L})$.

During the integrating phase, the switch 152 is opened and the capacitors $C_{4L}$, $C_{3L}$, $C_{2L}$ and $C_{1L}$ are connected in feedback. The total charge before the switch 152 is opened is the same as the total charge after the switch 152 is opened. Therefore:

$$Q_T = VC_T = V_{ref}(C_{1L} + C_{2L} + C_{3L}) = V(C_{1L} + C_{2L} + C_{3L} + C_{4L});$$

$$V = V_{ref} \frac{C_{1L} + C_{2L} + C_{3L}}{(C_{1L} + C_{2L} + C_{3L} + C_{4L})}.$$

Assuming that $C_{1L}$, $C_{2L}$, $C_{3L}$ and $C_{4L}$ are equal, $$V = \frac{3V_{ref}}{4}.$$

Figures 8G, 8H, 8I:
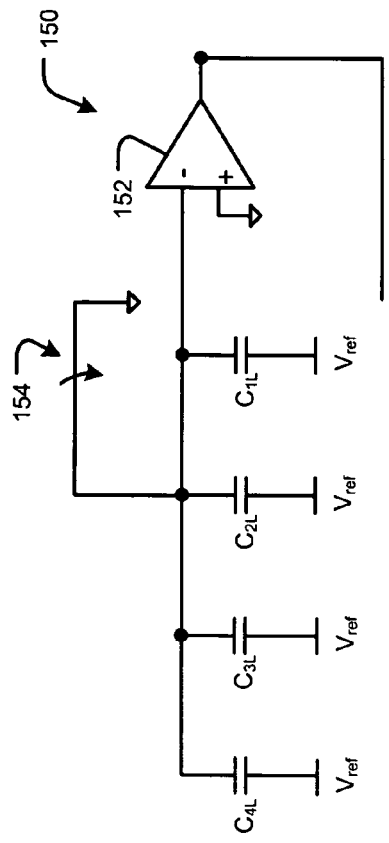
FIG. 8G illustrates the D/A converter of FIG. 8B during a sampling phase for a fourth digital value.
FIG. 8H is an exemplary timing diagram showing sampling and integrating phases for LSB and MSB portions.
FIG. 8I is an exemplary timing diagram showing sampling and integrating phases for LSB and MSB portions.

Referring now to FIG. 8G, an equivalent circuit of the D/A converter of FIG. 8B during a sampling phase is shown for $V_{CDAC}=V_{ref}$. The switch associated with this position may be omitted since this value can be already be obtained by using the next MSB. In this case one of the capacitors may always be connected to ground. If a switch is used, during sampling phase the switch 152 is closed and the capacitors $C_{1L}$, $C_{2L}$, $C_{3L}$ and $C_{4L}$ are charged to $V_{ref}$. A charge is accumulated on the capacitors $C_{1L}$, $C_{2L}$, $C_{3L}$ and $C_{4L}$ that is equal to $V_{ref}(C_{1L}+C_{2L}+C_{3L}+C_{4L})$.

During the integrating phase, the switch 152 is opened and the capacitors $C_{4L}$, $C_{3L}$, $C_{2L}$ and $C_{1L}$ are connected in feedback. The total charge before the switch 152 is opened is the same as the total charge after the switch 152 is opened. Therefore:

$$Q_T = VC_T = V_{ref}(C_{1L} + C_{2L} + C_{3L} + C_{4L}) = V(C_{1L} + C_{2L} + C_{3L} + C_{4L});$$

$$V = V_{ref} \frac{C_{1L} + C_{2L} + C_{3L} + C_{4L}}{(C_{1L} + C_{2L} + C_{3L} + C_{4L})}.$$

Assuming that $C_{1L}$, $C_{2L}$, $C_{3L}$ and $C_{4L}$ are equal, $V=V_{ref}$.

Referring now to FIGS. 8H and 8I, non-overlapping and overlapping timing diagrams are shown for sampling and integrating phases for LSB and MSB capacitive portions. The timing of the sampling and integrating phases can be non-overlapping as shown in FIG. 8H. Alternately, the sampling phase of the LSB capacitive portion can fully and/or partially overlap the integrating phase of the MSB capacitive portion as shown in FIG. 8I.

Figure 8J:
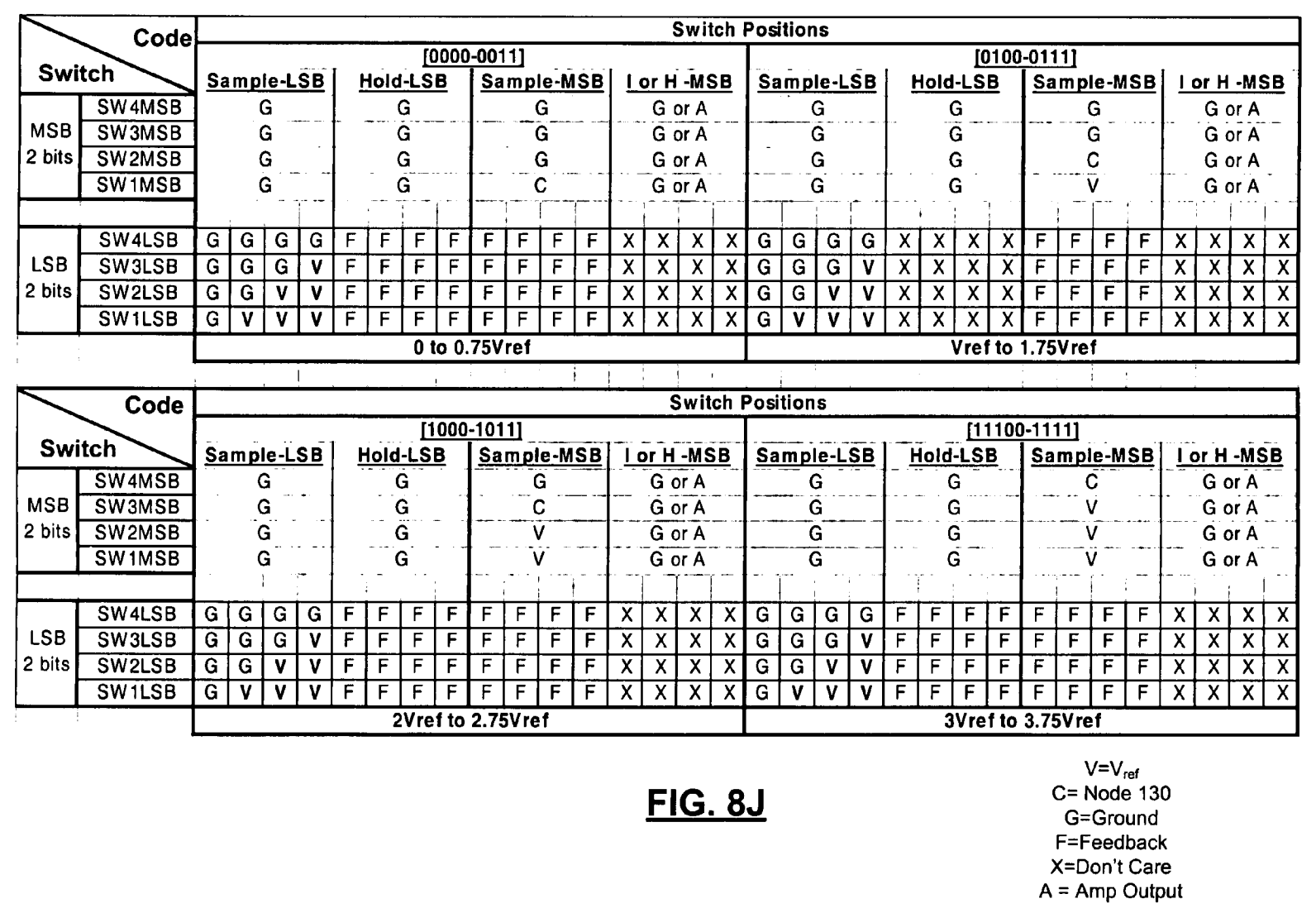

Referring now to FIG. 8J, a truth table for the D/A converter is shown. As can be appreciated, the LSB switches can be connected in feedback and/or to ground during the MSB-integrating phase and/or can begin the next LSB sampling phase as described herein.

Figure 9B:
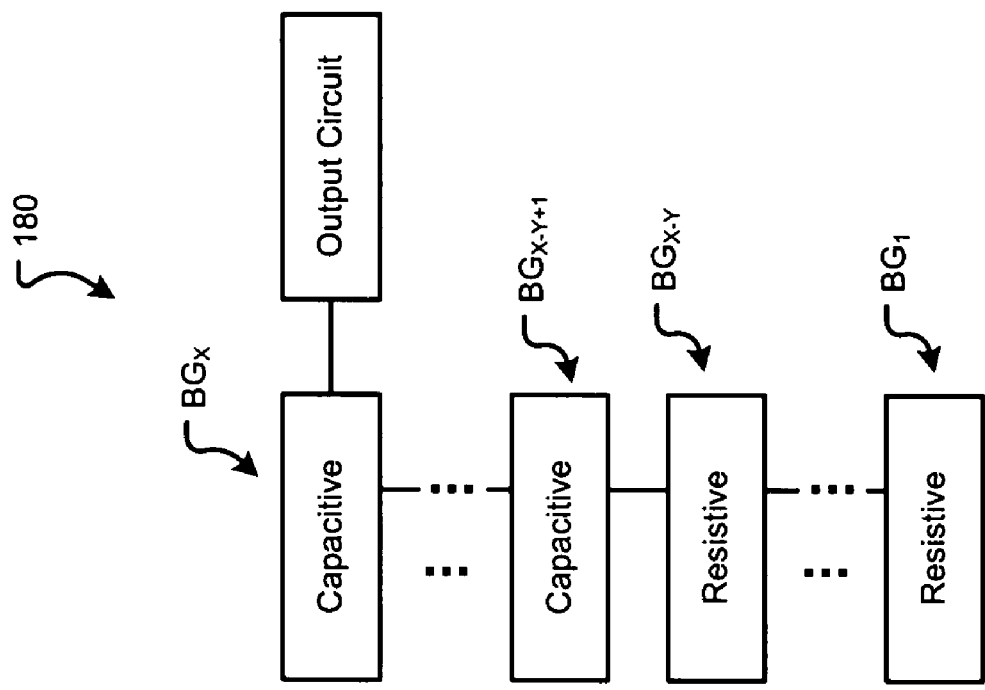
FIG. 9B illustrates an N-stage capacitive-resistive D/A converter.
Figure 9A:
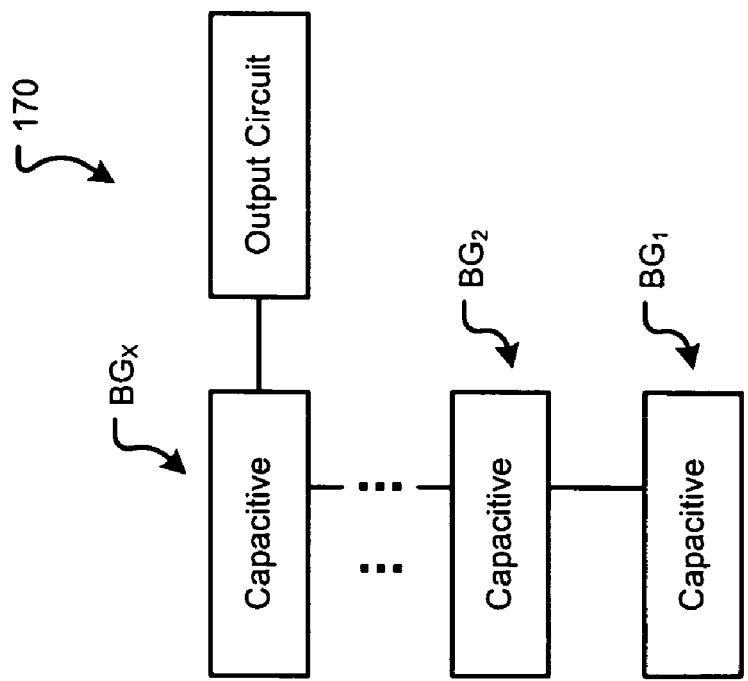
FIG. 9A illustrates an N-stage capacitive D/A converter.

Referring now to FIG. 9A-9D, additional capacitive and/or resistive DAC portions may be added. In FIG. 9A, an N stage capacitive D/A converter 170 is shown. The converter 170 includes capacitive portions $BG_1$, $BG_2$, . . . , and $BG_X$, which are associated with LSB, next LSB, . . . , and MSB groups. For example, a 6 bit example can include capacitive portions $BG_1$, $BG_2$ and $BG_3$. Each capacitive portion may include four capacitors as shown and described above. Each of the capacitive portions includes sampling and integrating stages that may be non-overlapping and/or overlapping as described above and below.

Figure 9C:
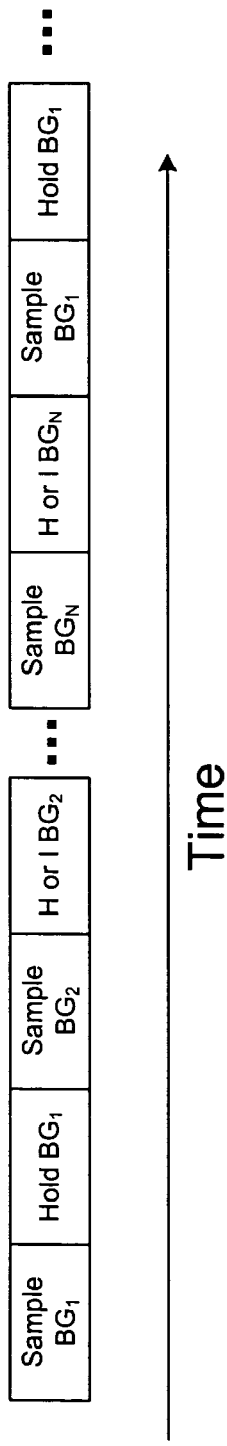
FIG. 9C is an exemplary timing diagram showing non-overlapping sampling and integrating phases for additional stages.
Figure 9D:
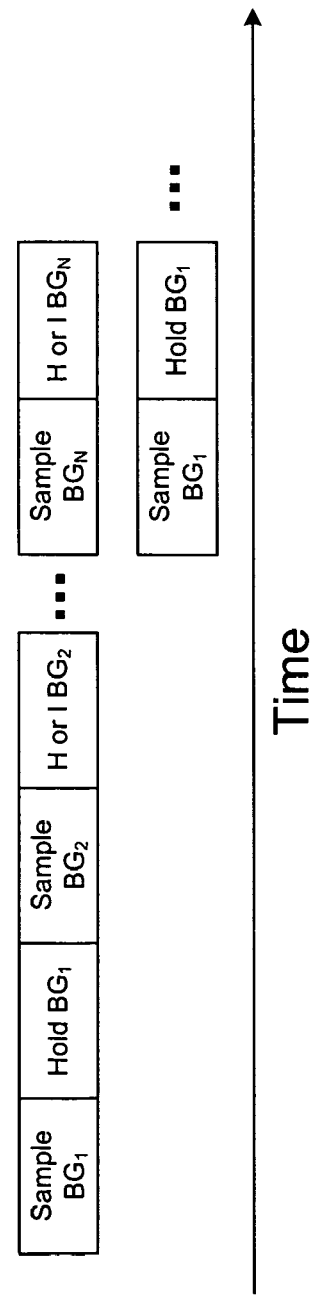
FIG. 9D is an exemplary timing diagram showing overlapping sampling and integrating phases for additional stages.

In FIG. 9B, an N stage capacitive-resistive D/A converter 180 is shown. One or more of the last stages is a resistive portion as described above. In this example, there are X-Y capacitive portions and Y resistive portions, where X and Y are integers greater than zero. When resistive portions are used, the sampling and integrating phases for the last capacitive stage and the final resistive stage can be the same as described above. In FIG. 9C, an exemplary timing diagram shows non-overlapping sampling and integrating phases for additional capacitive stages. In FIG. 9D, an exemplary timing diagram showing fully and/or partially overlapping sampling and integrating phases for additional capacitive stages is shown.

Figure 10:
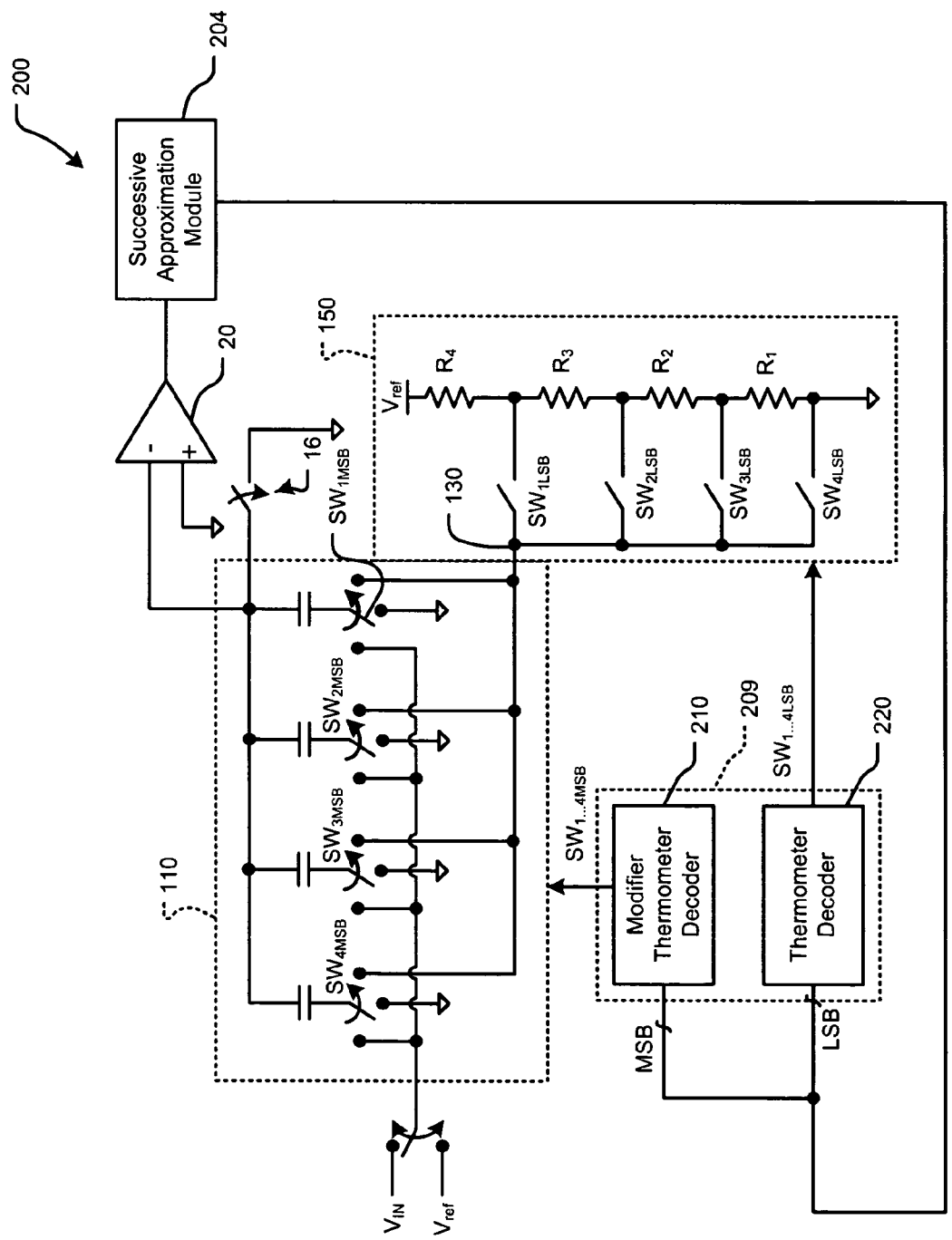
FIG. 10 is an electrical schematic of a successive approximation A/D converter according to the present invention.

Referring now to FIG. 10, a successive approximation A/D converter 200 is shown. The converter 200 includes a successive approximation register (SAR) 204 or module that contains logic for resolving the digital bits as will be described further below. An output of the SAR 204 is input to decoder module 209 that may include a modified thermometer decoder 210 that communicates with and controls switches $SW_{4MSB}$, $SW_{3MSB}$, $SW_{2MSB}$, and $SW_{1MSB}$ based on MSBs of the output of the SAR. An output of the SAR 204 is input to a thermometer decoder 220 that communicates with and controls switches $SW_{4LSB}$, $SW_{3LSB}$, $SW_{2LSB}$, and $SW_{1LSB}$ based on LSBs in the output of the SAR 204.

During acquisition, the switch 16 is connected to ground. Ends of the capacitors are connected by switches $SW_{MSB}$ to $V_{in}$. After acquisition of $V_{in}$, the switch 16 is opened and the capacitors are disconnected by switches $SW_{MSB}$ from $V_{in}$. The capacitor array is charged with a voltage based on $V_{in}$. The capacitors are then connected to ground by switches $SW_{MSB}$, which drives the common terminal negative to a voltage equal to $-V_{in}$.

As the first step in a binary search algorithm, the capacitive and resistive portions are configured to provide $\frac{1}{2}V_{ref}$ as described above. In other words, $C_{4M}$ is connected to the common node, $C_{3M}$, $C_{2M}$ and $C_{1M}$ are connected to $V_{ref}$ and the switch $SW_{1LSB}$ is closed. For example, if $V_{in}$ is equal to $\frac{3}{4}V_{ref}$, the common terminal will be driven to $(-\frac{3}{4}V_{ref}+\frac{1}{2}V_{ref}) = -\frac{1}{4}V_{ref}$. When this voltage is compared to ground, the output of the comparator 20 yields a logic '1', implying that $V_{in}$ is greater than $\frac{1}{2}V_{ref}$. If $V_{in}$ is equal to $\frac{1}{4}V_{ref}$, the common terminal voltage is $(-\frac{1}{4}V_{ref}+\frac{1}{2}V_{ref}) = +\frac{1}{4}V_{ref}$ and the output of the comparator 20 is a logic '0'. This process continues with the next MSB or LSB depending upon the value of the comparator output until all bits are resolved. While capacitive-resistive implementation is shown, capacitive-capacitive, N-stage capacitive or N-stage capacitive-resistive implementations are also contemplated.

Figure 11A:
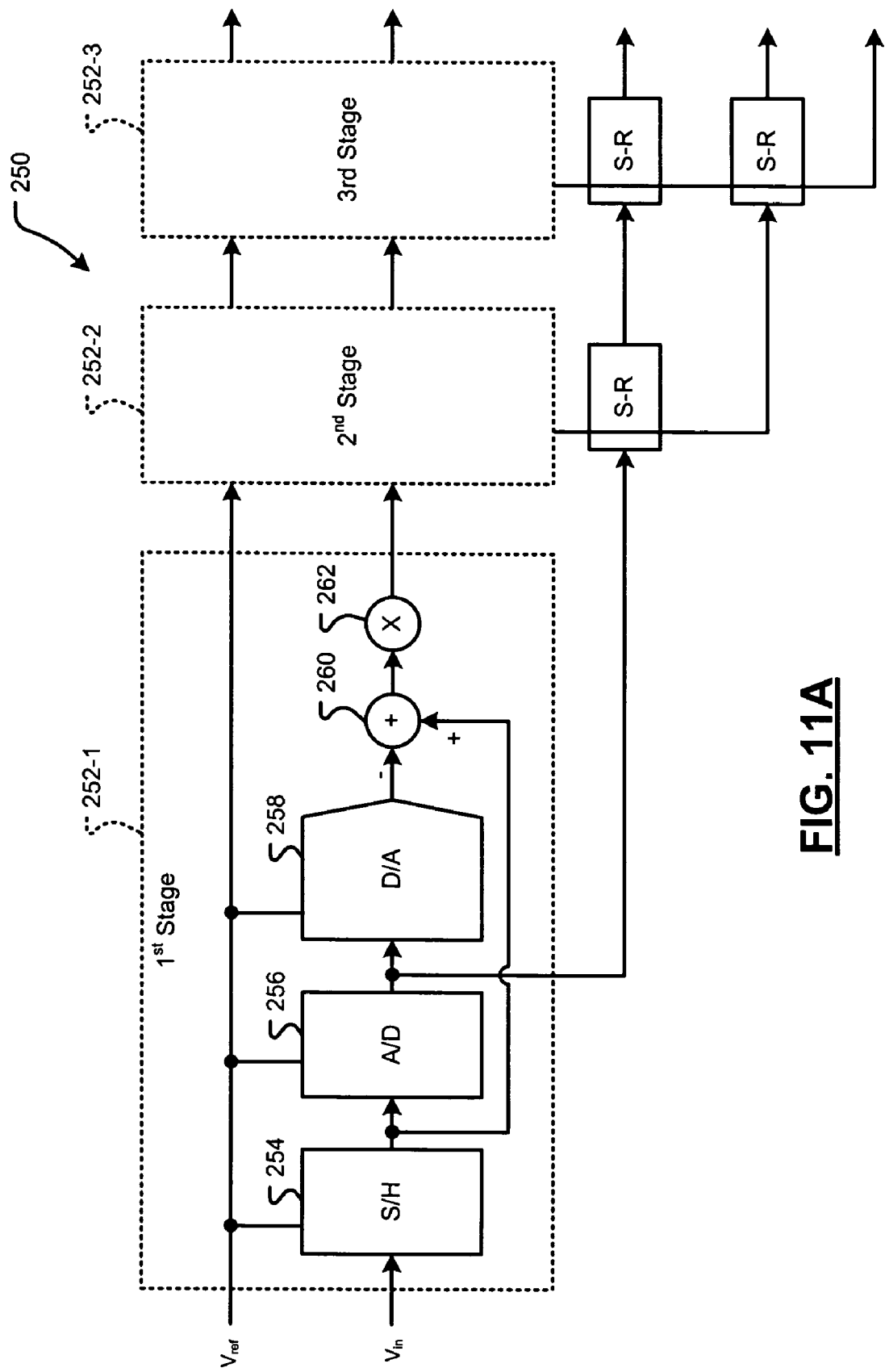
FIG. 11A is an electrical schematic of a pipelined A/D converter according to the present invention.

Referring now to FIG. 11A, a pipelined A/D converter 250 is shown. The converter 250 includes a plurality of stages 252-1, 252-2, 252-3 (collectively 252) that are cascaded in series. Each of the course A/D converter stages 252 includes a sample and hold module 254 that samples and holds the analog output signal from a prior stage, a low resolution A/D subconverter module 256 that converts the held analog signal, a low-resolution D/A subconverter module 258 that converts the resulting digital output back into an analog representation, a difference module 260 and an analog interstage difference amplifier module 262 that amplifies the residue. The residue is the difference between the held analog signal and the reconstructed analog signal.

The first stage 252-1 of the pipelined A/D converter 250 operates on a most current analog input sample while the second stage 252-2 operates on the amplified residue of the previous input sample. The concurrency of operations results in a conversion speed that is determined only by the time it takes in one stage.

Figure 11B:
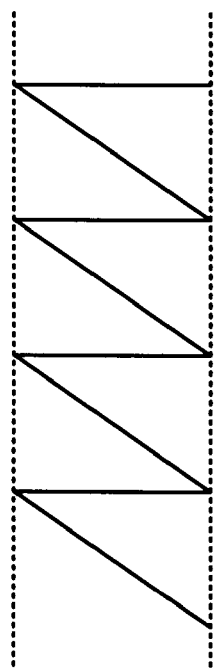
FIG. 11B-11D illustrate ideal and non-ideal residue voltages.
Figure 11C:
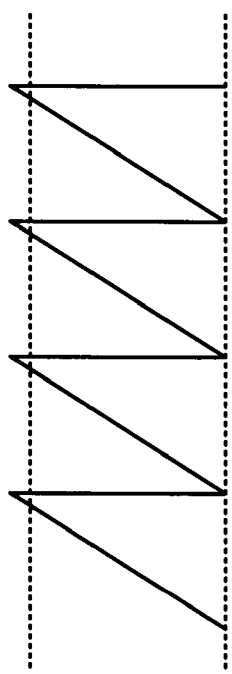
Figure 11D:
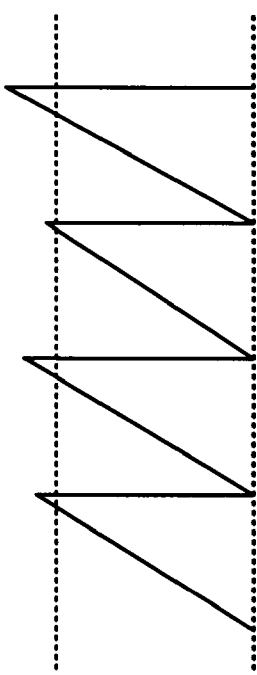

Referring now to FIG. 11B-11D, ideal and non-ideal residue voltages are shown. In FIG. 11B, an ideal residue voltage is shown. When the input reaches a first decision level of the AND subconverter module 252, the output of the subconverter module switches to its next higher level code causing the output of the D/A subconverter to switch to its next higher level. This in turn causes the amplified residue to drop back to zero.

In actual implementations, however, the components are not ideal and non-uniformity occurs. In FIG. 11C, the residue voltage exceeds the ideal value by a fixed amount. In FIG. 11D, the residue voltage exceeds the ideal residue voltage by a variable amount.

Referring now to FIG. 12A, an analog to digital converter 300 that generates a residue voltage with lower variation according to the present invention is shown. Capacitors $C_1$, $C_2$, $C_3$ and $C_4$ are selectively connected to $V_{in}$, a reference potential such as ground, a voltage reference ($V_{ref}$) and to an output of the opamp 20. In some implementations, $C_1$, $C_2$, $C_3$ and $C_4$ have substantially equal capacitance values.

Figures 12C, 12D:
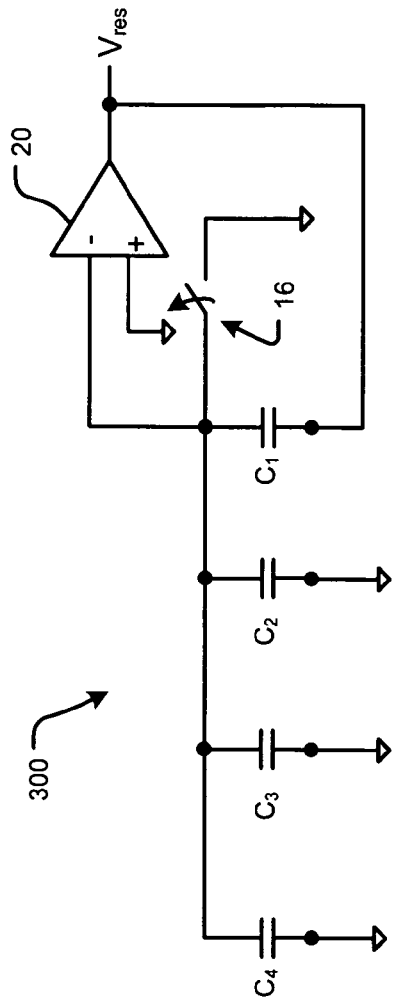
FIG. 12C illustrates the A/D converter of FIG. 12A in a residue amplification stage for a first voltage input value.
FIG. 12D is an exemplary truth table for the A/D converter of FIG. 12A.

Referring now to FIGS. 12B-12D, the analog to digital converter of FIG. 12A is shown further. In a sampling phase in FIG. 12B, the switch 16 is closed and the capacitors are connected to $V_{in}$. In a residue amplification stage in FIG. 12B for $V_{in}$ between 0 and $$\frac{C_1}{C_1+C_2+C_3+C_4}V_{ref}$$

("A" in FIG. 12D), the switch 16 is opened, the capacitor $C_1$ is connected in feedback arrangement. The capacitors $C_2$, $C_3$, and $C_4$ are connected to the reference potential. A truth table is shown in FIG. 12D.

Figure 13:
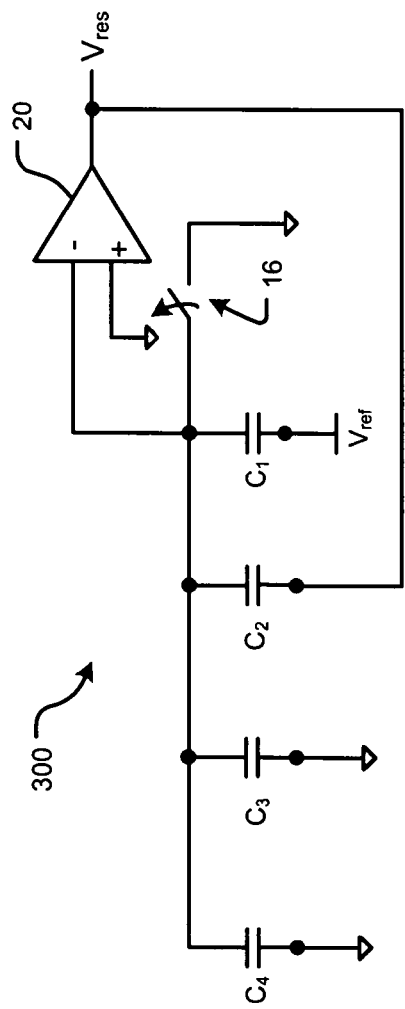
FIG. 13 illustrates the A/D converter of FIG. 12A in a residue amplification stage for a second voltage input value.

Referring now to FIG. 13, in a residue amplification stage for $V_{in}$ between $$\frac{C_1}{C_1+C_2+C_3+C_4}V_{ref} \text{ and } \frac{C_1+C_2}{C_1+C_2+C_3+C_4}V_{ref}$$

("B" in FIG. 12D), the switch 16 is opened, the capacitor $C_2$ is connected in feedback arrangement and the capacitor $C_1$ is connected to $V_{ref}$. The capacitors $C_3$ and $C_4$ are connected to a reference potential.

Figure 14:
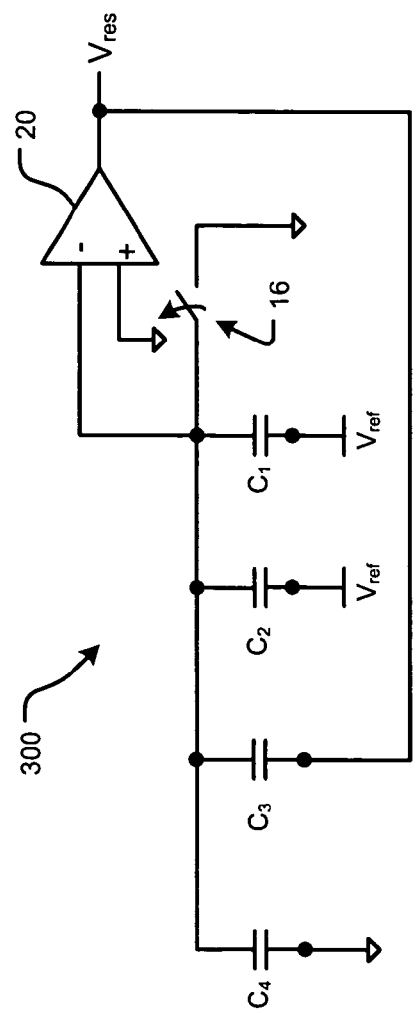
FIG. 14 illustrates the A/D converter of FIG. 12A in a residue amplification stage for a third voltage input value.

Referring now to FIG. 14, in a residue amplification stage for $V_{in}$ between $$\frac{C_1+C_2}{C_1+C_2+C_3+C_4}V_{ref} \text{ and } \frac{C_1+C_2+C_3}{C_1+C_2+C_3+C_4}V_{ref}$$

("C" in FIG. 12D), the switch 16 is opened, the capacitor $C_3$ is connected in feedback arrangement and the capacitors $C_1$ and $C_2$ are connected to $V_{ref}$. The capacitor $C_4$ is connected to a reference potential.

Figure 15:
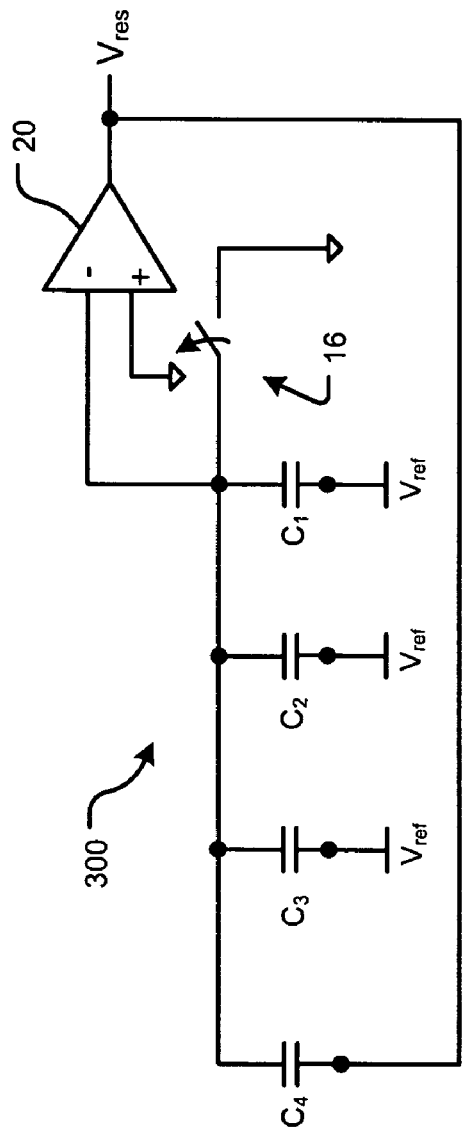
FIG. 15 illustrates the A/D converter of FIG. 12A in a residue amplification stage for a fourth voltage input value.
Figure 16:
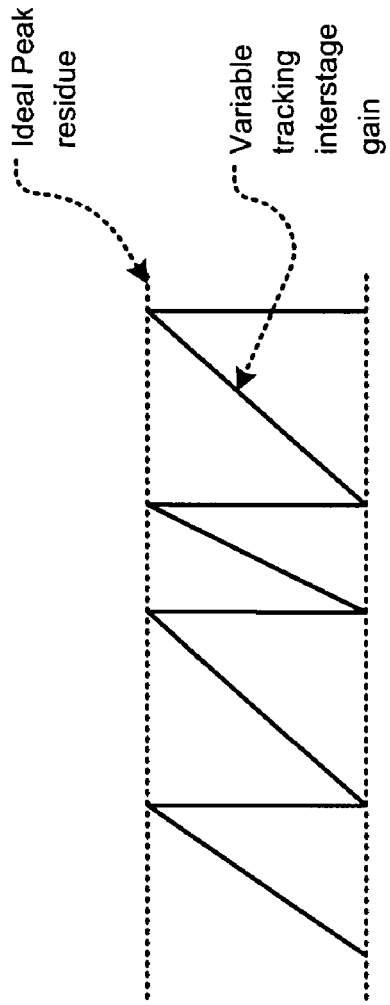
FIG. 16 is a graph illustrating variable interstage gain and an ideal residue voltage of the circuit of FIG. 12A.

Referring now to FIGS. 15 and 16, in a residue amplification stage for $V_{in}$ between $$\frac{C_1+C_2+C_3}{C_1+C_2+C_3+C_4}V_{ref} \text{ and } V_{ref}$$

("D" in FIG. 12D), the switch 16 is opened, the capacitor $C_4$ is connected in feedback arrangement and the capacitors $C_1$, $C_2$ and $C_3$ are connected to $V_{ref}$. Note that because the different capacitors are used as the feedback capacitor during residue amplification, the residue gain can perfectly track the capacitor mismatch. The residue voltage now looks as shown in FIG. 16. There is a variable inter-stage gain and a substantially constant maximum residue voltage.

Figure 17B:
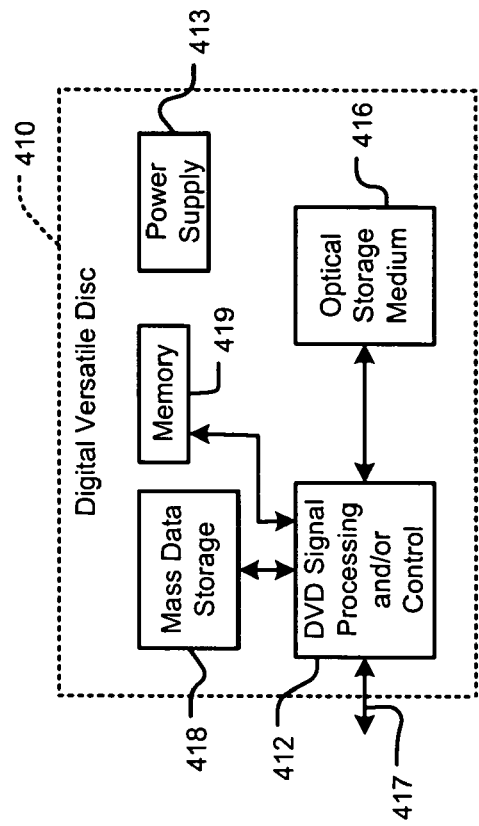
FIG. 17B is a functional block diagram of a digital versatile disk (DVD)
Figure 17A:
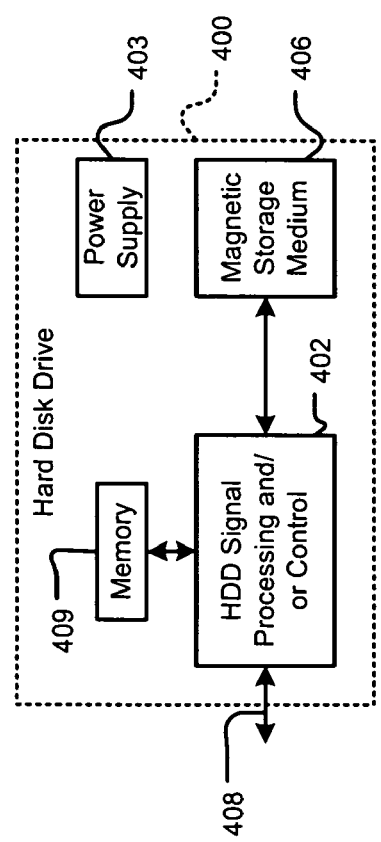
FIG. 17A is a functional block diagram of a hard disk drive.

Referring now to FIGS. 17A-17G, various exemplary implementations of the present invention are shown. Referring now to FIG. 17A, the present invention can be implemented in D/A or A/D converters in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 17B, the present invention can be implemented in D/A or A/D converters in a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 17A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 17D:
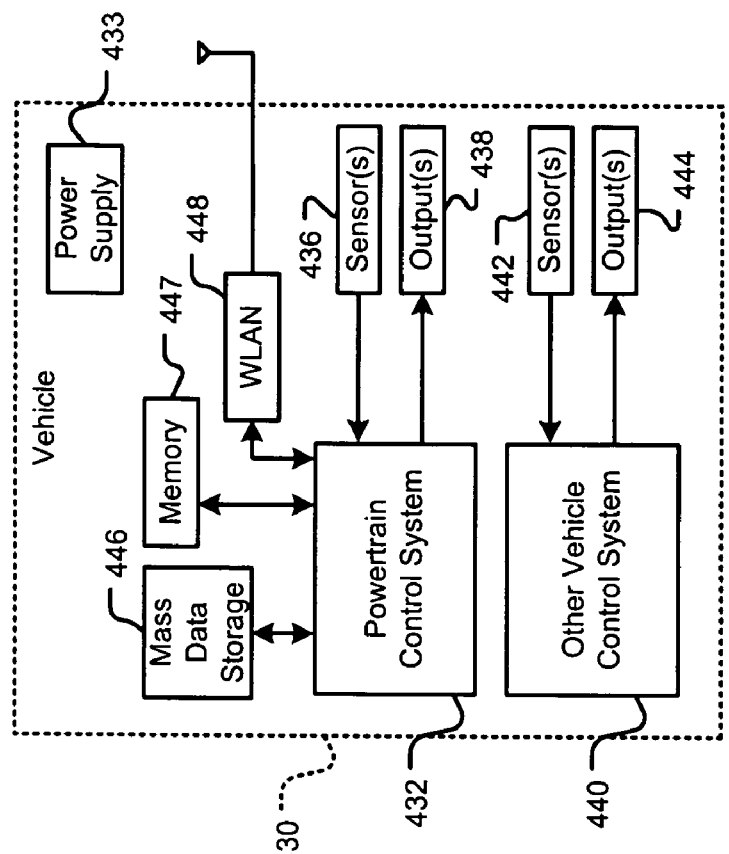
FIG. 17D is a functional block diagram of a vehicle control system.
Figure 17C:
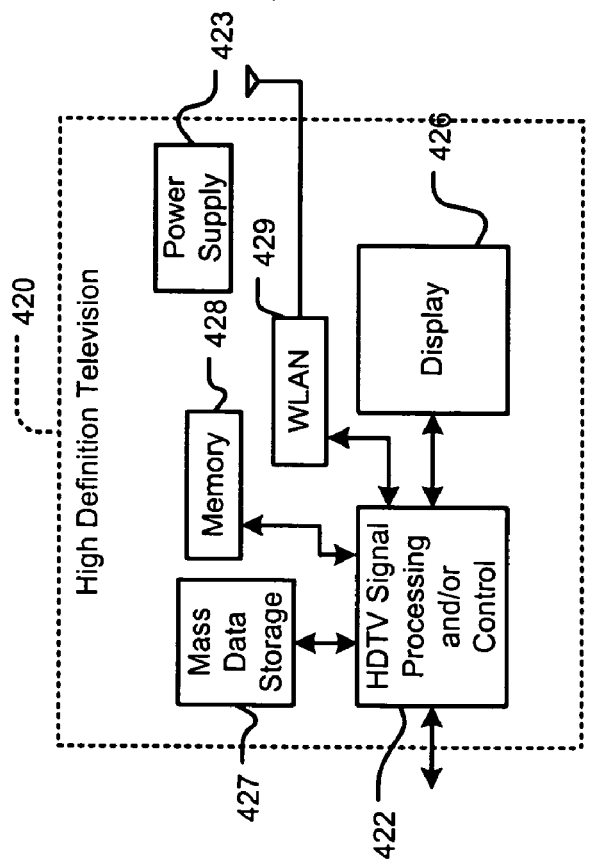
FIG. 17C is a functional block diagram of a high definition television.

Referring now to FIG. 17C, the present invention can be implemented in D/A or A/D converters in a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 17A and/or at least one DVD may have the configuration shown in FIG. 17B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 17D, the present invention may implement and/or be implemented in D/A or A/D converters in a control system of a vehicle 430, a WLAN interface, mass data storage of the vehicle control system and/or a power supply 433. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 17E:
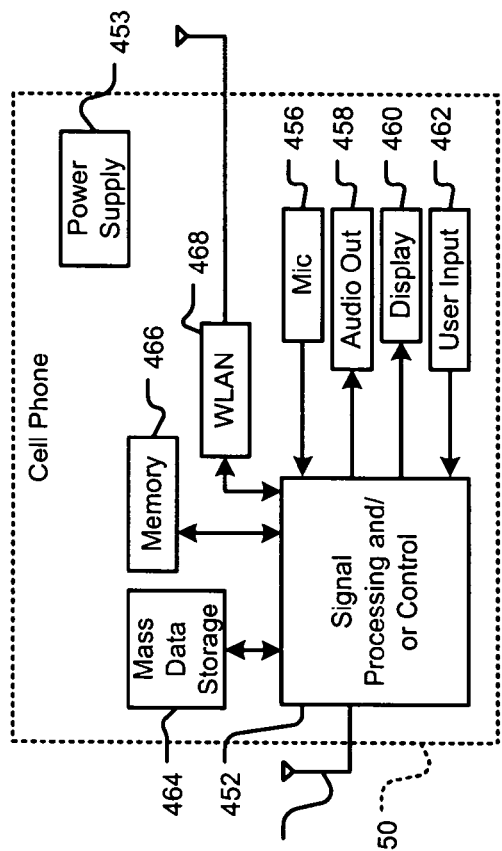
FIG. 17E is a functional block diagram of a cellular phone.

Referring now to FIG. 17E, the present invention can be implemented in D/A or A/D converters in a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 17F:
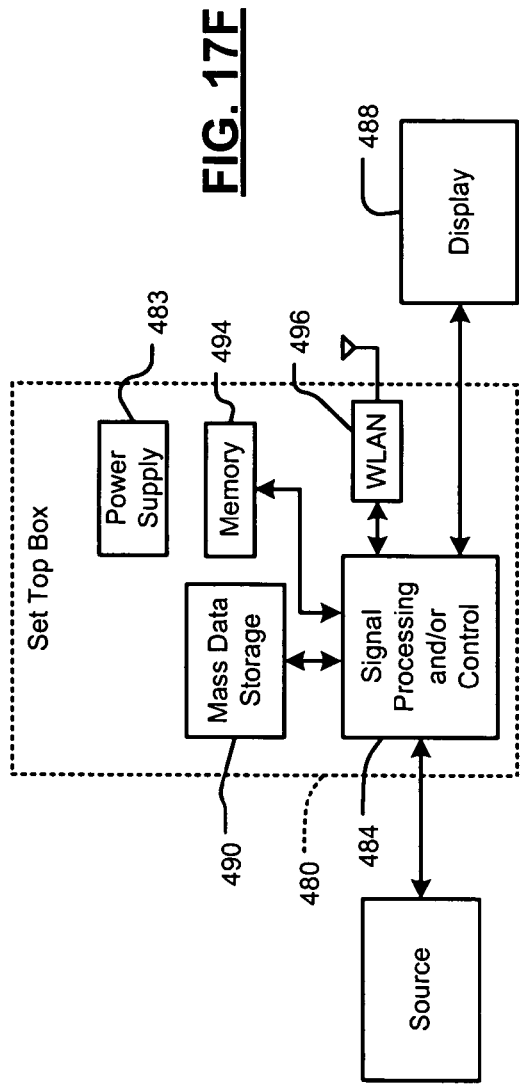
FIG. 17F is a functional block diagram of a set top box.

Referring now to FIG. 17F, the present invention can be implemented in D/A or A/D converters in a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 17G:
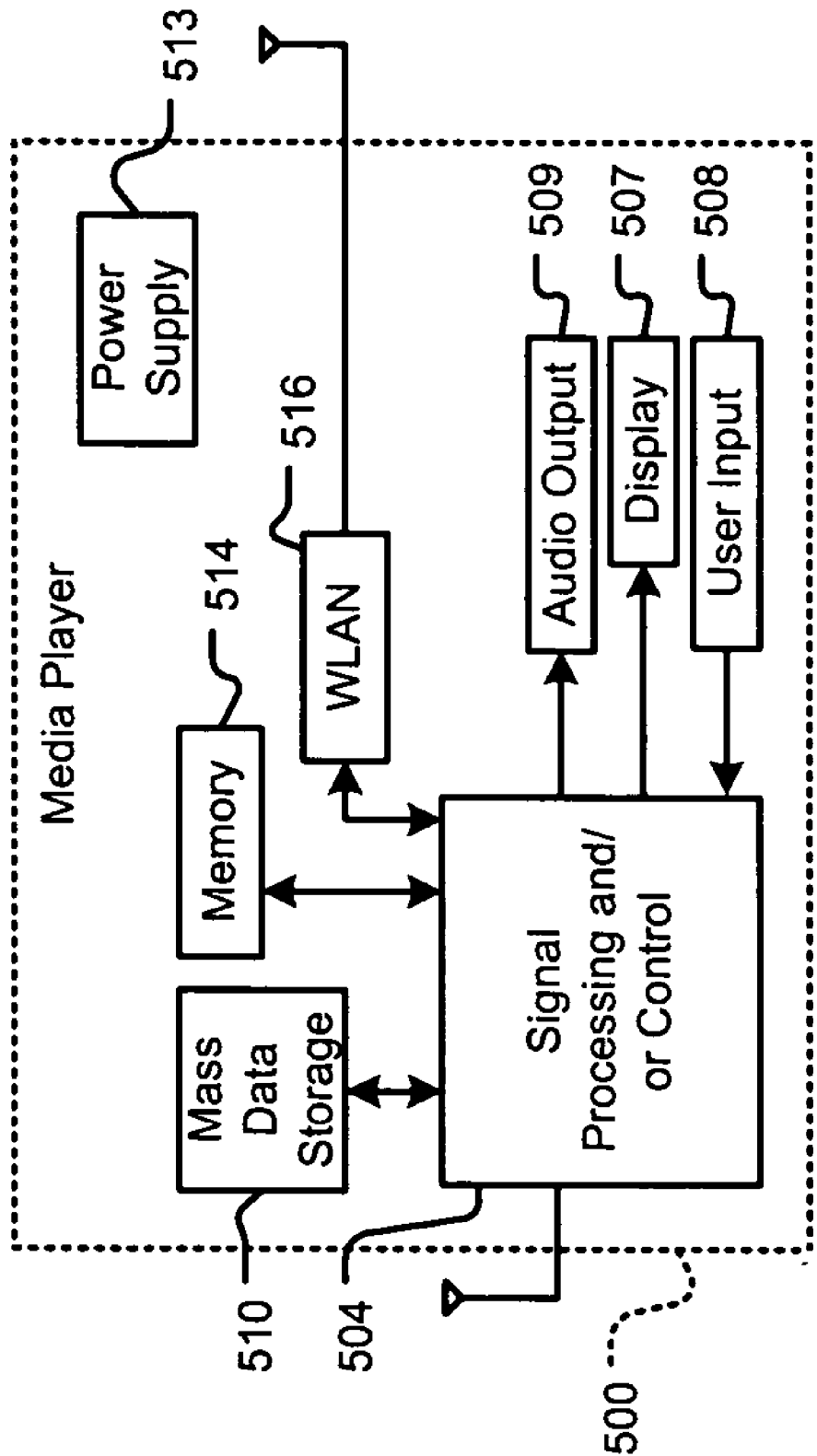
FIG. 17G is a functional block diagram of a media player.

Referring now to FIG. 17G, the present invention can be implemented in D/A or A/D converters in a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 17A and/or at least one DVD may have the configuration shown in FIG. 17B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A digital to analog converter (DAC) comprising:
   X capacitive DACs that are connected together in series, wherein X is an integer greater than one, and wherein each of said X capacitive DACs comprise:
      M switches wherein M is an integer greater than one;
      a signal input;
      a signal output; and
      M capacitances that communicate with said M switches, respectively, and that have first and second ends and substantially equal capacitance values,
      wherein said M switches selectively connect said first ends of said M capacitances to said signal output, and
      wherein said M switches connect said second end of a selected one of said M capacitances to said signal input when said second ends of nonselected ones of said M capacitances are not connected to said signal input; and
   a first DAC that has a signal output that communicates with said signal input of one of said X capacitive DACs.

2. The DAC of claim 1 further comprising:
   an amplifier having an input and an output;
   a feedback capacitance that communicates with said input and said output of said amplifier,
   wherein said first ends of said M capacitances of another one of said X capacitive DACs communicates with a reference potential during a first phase of said another one of said X capacitive DACs, and
   wherein said input of said amplifier selectively communicates with said first ends of said M capacitances of said another one of said X capacitive DACs during a second phase of said another one of said X capacitive DACs.

3. The DAC of claim 1 further comprising a control module that selectively generates switching signals to control said X capacitive DACs and said first DAC.

4. The DAC of claim 1 wherein said first DAC comprises Y resistive DACs wherein Y is an integer greater than zero.

5. A successive approximation analog-to-digital converter comprising the DAC of claim 1.

6. The DAC of claim 1 wherein said first DAC comprises Y resistive converting means for converting a digital signal to an analog signal and wherein Y is an integer greater than zero.

7. The DAC of claim 6 wherein at least one of said Y resistive converting means comprises:
   a signal output;
   N resistance means for providing resistance and that is connected in series between said voltage reference and said reference potential;
   N nodes between select ones of said N resistance means and said reference potential; and
   N second switching means for selectively connecting said signal output of said one of said Y resistive converting means to one of said N nodes.

8. The DAC of claim 1 further comprising:
   amplifying means for amplifying and having an input and an output,
   wherein said first ends of said M capacitance means of another one of said X capacitive converting means communicate with a reference potential during a first phase of said another one of said X capacitive converting means,
   wherein said input of said amplifying means selectively communicates with said first ends of said M capacitance means of said another one of said X capacitive converting means during a second phase of said another one of said X capacitive converting means, and
   wherein said second ends of said of said M capacitance means of said another one of said X capacitive converting means communicate with said output of said amplifying means during said second phase of said another one of said X capacitive converting means.

9. The DAC of claim 1 wherein said first DAC comprises a capacitive DAC.

10. The DAC of claim 9 wherein said capacitive DAC comprises:
    a signal output;
    an amplifier having an input and an output that communicates with said signal output;
    M second capacitances connected in parallel and having first ends and second ends, wherein said first ends selectively communicate with a reference potential during a first phase of said capacitive DAC and wherein said first ends selectively communicate with said input of said amplifier during a second phase of said capacitive DAC; and
    M second switches that selectively connect said second ends of said M second capacitances to one of said voltage reference and said reference potential during said first phase of said capacitive DAC and that selectively connect said second ends of said M second capacitances to said output during said second phase of said capacitive DAC.

11. A digital to analog converter (DAC) comprising:
    X capacitive converting means for converting a digital signal to an analog signal and that are connected in series and wherein X is an integer greater than one, wherein each of said X capacitive converting means comprise:
       M switching means for switching wherein M is an integer greater than one;
       a signal input;
       a signal output; and
       M capacitance means for providing capacitance and that communicate with said M switching means, respectively, and that have first and second ends and substantially equal capacitance values,
       wherein said M switching means selectively connect said first ends of said M capacitance means to said signal output, and
       wherein said M switching means connect said second end of a selected one of said M capacitance means to said signal input when said second ends of nonselected ones of said M capacitance means are not connected to said signal input; and
    first converting means for converting a digital signal to an analog signal and that has a signal output that communicates with said signal input of one of said X capacitive converting means.

12. The DAC of claim 11 further comprising:
    amplifying means for amplifying and having an input and an output;

feedback capacitance means for providing capacitance and that communicates with said input and said output of said amplifying means,
  wherein said first ends of said M capacitance means of another one of said X capacitive converting means communicates with a reference potential during a first phase of said another one of said X capacitive converting means, and
  wherein said input of said amplifying means selectively communicates with said first ends of said M capacitance means of said another one of said X capacitive converting means during a second phase of said another one of said X capacitive converting means.

13. A successive approximation analog-to-digital converter comprising the DAC of claim 11.

14. The DAC of claim 11 wherein said first DAC comprises a capacitive converting means for converting a digital signal to an analog signal.

15. The DAC of claim 14 wherein said capacitive converting means comprises:
  a signal output;
  amplifying means for amplifying and having an input and an output that communicates with said signal output;
  M second capacitance means for providing capacitance and that is connected in parallel and having first ends and second ends, wherein said first ends selectively communicate with a reference potential during a first phase of said capacitive DAC and wherein said first ends selectively communicate with said input of said amplifying means during a second phase of said capacitive DAC; and
  M second switching means for selectively connecting said second ends of said M second capacitance means to one of said voltage reference and said reference potential during said first phase of said capacitive DAC and for selectively connecting said second ends of said M second capacitance means to said output during said second phase of said capacitive DAC.

16. The DAC of claim 11 further comprising control means for selectively generating switching signals to control said X capacitive converting means and said first DAC.

17. A digital to analog converter (DAC) comprising:
  X capacitive DACs that are connected together in series, wherein X is an integer greater than one, and wherein each of said X capacitive DACs comprise:
    M switches wherein M is an integer greater than one;
    a signal input;
    a signal output; and
    M capacitances that communicate with said M switches, respectively, and that have first and second ends and substantially equal capacitance values,
    wherein said M switches selectively connect said first ends of said M capacitances to said signal output, and
    wherein said M switches connect said second end of a selected one of said M capacitances to said signal input;
  a first DAC that has a signal output that communicates with said signal input of one of said X capacitive DACs;
  an amplifier having an input and an output,
  wherein said first ends of said M capacitances of another one of said X capacitive DACs communicate with a reference potential during a first phase of said another one of said X capacitive DACs,
  wherein said input of said amplifier selectively communicates with said first ends of said M capacitances of said another one of said X capacitive DACs during a second phase of said another one of said X capacitive DACs, and
  wherein said second ends of said of said M capacitances of said another one of said X capacitive DACs communicate with said output of said amplifier during said second phase of said another one of said X capacitive DACs.

18. A successive approximation analog-to-digital converter comprising a digital to analog converter (DAC), the DAC comprising:
  X capacitive converting means for converting a digital signal to an analog signal and that are connected in series and wherein X is an integer greater than one, wherein each of said X capacitive converting means comprise:
    M switching means for switching wherein M is an integer greater than one;
    a signal input;
    a signal output; and
    M capacitance means for providing capacitance and that communicate with said M switching means, respectively, and that have first and second ends and substantially equal capacitance values,
    wherein said M switching means selectively connect said first ends of said M capacitance means to said signal output, and
    wherein said M switching means connect said second end of a selected one of said M capacitance means to said signal input; and
  first converting means for converting a digital signal to an analog signal and that has a signal output that communicates with said signal input of one of said X capacitive converting means;
  the successive approximation analog-to-digital converter further comprising:
  amplifying means for amplifying and having an input that selectively communicates with one of said X capacitive DACs;
  approximation means for successive approximating and that communicates with an output of said amplifying means;
  decoding means that communicates with an output of said successive approximation module for selectively generating switching signals for said X capacitive DACs and said first DAC.

19. A successive approximation analog-to-digital converter comprising a digital to analog converter (DAC), the DAC comprising:
  X capacitive DACs that are connected together in series, wherein X is an integer greater than one, and wherein each of said X capacitive DACs comprise:
    M switches wherein M is an integer greater than one;
    a signal input;
    a signal output; and
    M capacitances that communicate with said M switches, respectively, and that have first and second ends and substantially equal capacitance values,
    wherein said M switches selectively connect said first ends of said M capacitances to said signal output, and
    wherein said M switches connect said second end of a selected one of said M capacitances to said signal input;
  a first DAC that has a signal output that communicates with said signal input of one of said X capacitive DACs;
  the successive approximation analog-to-digital converter further comprising:
  an amplifier having an input that selectively communicates with one of said X capacitive DACs;
  a successive approximation module that communicates with an output of said amplifier;

a decoding module that communicates with an output of said successive approximation module and that selectively generates switching signals for said X capacitive DACs and said first DAC.

20. A digital to analog converter (DAC) comprising:
X capacitive DACs that are connected together in series, wherein X is an integer greater than one, and wherein each of said X capacitive DACs comprise:
M switches wherein M is an integer greater than one;
a signal input;
a signal output; and
M capacitances that communicate with said M switches, respectively, and that have first and second ends and substantially equal capacitance values,
wherein said M switches selectively connect said first ends of said M capacitances to said signal output, and
wherein said M switches connect said second end of a selected one of said M capacitances to said signal input; and
a first DAC that has a signal output that communicates with said signal input of one of said X capacitive DACs,
wherein said first DAC comprises Y resistive DACs wherein Y is an integer greater than zero, and
wherein at least one of said Y resistive DACs comprises:
a signal output;
N resistances connected in series between said voltage reference and said reference potential;
N nodes between select ones of said N resistances and said reference potential; and
N second switches that selectively connect said signal output of said one of said Y resistive DACs to one of said N nodes.

21. A method for operating a digital to analog converter (DAC) comprising:
connecting X capacitive DACs in series and wherein X is an integer greater than one, wherein each of said X capacitive DACs comprise M capacitances that have first and second ends and substantially equal capacitance values;
selectively connecting said first ends of said M capacitances to said signal output;
connecting said second end of a selected one of said M capacitances to said signal input when said second ends of nonselected ones of said M capacitances are not connected to said signal input; and
connecting a signal output of a first DAC to said signal input of one of said X capacitive DACs.

22. The method of claim 21 further comprising:
providing an amplifier having an input and an output and a feedback capacitance that communicates with said input and said output of said amplifier;
connecting said first ends of said M capacitances of another one of said X capacitive DACs with a reference potential during a first phase of said another one of said X capacitive DACs; and
selectively connecting said input of said amplifier to said first ends of said M capacitances of said another one of said X capacitive DACs during a second phase of said another one of said X capacitive DACs.

23. The method of claim 21 further comprising:
providing an amplifier having an input and an output;
selectively connecting said first ends of said M capacitances of another one of said X capacitive DACs with a reference potential during a first phase of said another one of said X capacitive DACs;
selectively connecting said input of said amplifier with said first ends of said M capacitances of said another one of said X capacitive DACs during a second phase of said another one of said X capacitive DACs; and
selectively connecting said second ends of said of said M capacitances of said another one of said X capacitive DACs communicate with said output of said amplifier during said second phase of said another one of said X capacitive DACs.

24. The method of claim 21 wherein said first DAC comprises Y resistive DACs wherein Y is an integer greater than zero.

25. The method of claim 21 further comprising selectively generating switching signals to control said X capacitive DACs and said first DAC.

26. The method of claim 21 further comprising using said X capacitive DACs to successively approximate an analog input signal.

27. The method of claim 21 wherein said first DAC comprises a capacitive DAC.

* * * * *

UNITED STATES PATENT AND TRADEMARK OFFICE
CERTIFICATE OF CORRECTION

| | |
|---|---|
| PATENT NO. | : 7,443,329 B2 |
| APPLICATION NO. | : 11/481476 |
| DATED | : October 28, 2008 |
| INVENTOR(S) | : Sehat Sutardja |

It is certified that error appears in the above-identified patent and that said Letters Patent is hereby corrected as shown below:

| | |
|---|---|
| Title Page 2 | Under "Other Publications" J. John Connolly reference, delete "Approximatino" and insert -- Approximation -- |
| Title Page 2 | Under "Other Publications" reference beginning with "Application of the Operational Transconductance..." delete "Voltage-conrolled" and insert -- Voltage-controlled -- |
| Column 1, Line 52 | Delete "at" after "shown" |
| Column 1, Line 63 | Insert -- is -- after "54" |
| Column 2, Line 48 | Insert -- of -- after "output" |
| Column 4, Line 37 | Deleted second occurrence "of the" |
| Column 4, Line 53 | Delete "of" after "converter" |
| Column 5, Line 24 | Delete "and" after "amplifying" |
| Column 6, Line 51 | Delete second occurrence "of the" |
| Column 8, Line 54 | Delete "C" and insert -- $C_f$ -- |
| Column 10, Line 1 | Delete "Cf" and insert -- $C_f$ -- |
| Column 13, Line 34 | Delete "be" after "can" |
| Column 15, Line 16 | Delete "AND" and insert -- A/D -- |
| Column 17, Line 23 | Delete "implement" and insert -- implements -- |
| Column 20, Line 12 | Delete second occurrence "of said" |
| Column 22, Line 1 | Delete second occurrence "of said" |
| Column 24, Line 27 | Delete second occurrence "of said" |

Signed and Sealed this

Seventeenth Day of February, 2009

JOHN DOLL
*Acting Director of the United States Patent and Trademark Office*